US007969223B1

(12) United States Patent
Gilbert

(10) Patent No.: US 7,969,223 B1
(45) Date of Patent: Jun. 28, 2011

(54) TEMPERATURE COMPENSATION FOR LOGARITHMIC CIRCUITS

(75) Inventor: Barrie Gilbert, Portland, OR (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/772,082

(22) Filed: Apr. 30, 2010

(51) Int. Cl.
*G06F 7/556* (2006.01)
*H03K 17/14* (2006.01)

(52) U.S. Cl. ......................... 327/350; 327/378; 327/346

(58) Field of Classification Search .................. 327/350, 327/362, 346–349, 378
See application file for complete search history.

(56) References Cited

U.S. PATENT DOCUMENTS 3,992,622 A * 11/1976 Numata et al. ............ 250/214 C
4,604,532 A 8/1986 Gilbert
5,327,029 A * 7/1994 Ericson et al. ................ 327/350
5,699,004 A * 12/1997 Picciotto ....................... 327/350
7,310,656 B1 * 12/2007 Gilbert .......................... 708/851
7,342,407 B2 * 3/2008 Kuwana et al. .......... 324/750.02

OTHER PUBLICATIONS

AD8304 Data Sheet, Analog Devices, 160 dB Logarithmic Amplifier with Photo-Diode Interface, Data Sheet, 2002, pp. 1-20.
Gilbert, Barrie, "The Multi-tanh Principle: A Tutorial Overview," IEEE, 1998, 16 pages.

* cited by examiner

*Primary Examiner* — Dinh T. Le
(74) *Attorney, Agent, or Firm* — Marger Johnson & McCollom PC

(57) ABSTRACT

An embodiment of a logarithmic circuit may include a logging transistor, and a multi-tanh circuit arranged to provide temperature compensation to the logging transistor, where the multi-tanh circuit comprises a multiplicity of multi-tanh cells. In another embodiment, a logarithmic circuit may include a logging transistor, and a multi-tanh circuit arranged to provide temperature compensation to the logging transistor, where the multi-tanh circuit includes a first set of outputs arranged to provide an output signal and a second set of one or more outputs that are diverted.

23 Claims, 17 Drawing Sheets

TEMPERATURE COMPENSATION FOR LOGARITHMIC CIRCUITS

BACKGROUND

FIG. 1 illustrates a prior art logarithmic amplifier (log amp) that utilizes the logarithmic properties of a bipolar junction transistor (BJT) to measure a signal having a large dynamic range. The operational amplifier (op amp) OA1 forces the collector current $I_C$ of transistor Q1 to equal the input current $I_X$ while maintaining the collector-base voltage very close to zero. The output signal $V_{LOG}$ is then equal to the base-emitter voltage of transistor Q1. Because the output has a logarithmic relation to the input as explained below, the large dynamic range of the input signal is reduced to relatively smaller dynamic range at the output for ease of further processing.

The circuit of FIG. 1, which is known as a transdiode connection or Patterson diode, takes advantage of the very reliable mathematical relationship between the collector current ($I_C$) and the base-emitter voltage ($V_{BE}$) which may be expressed as follows:

$$V_{BE}=V_K\ln(I_C/I_S+1) \quad \text{(Eq. 1)}$$

where $V_K$ is the thermal voltage kT/q which is about 26 mV at 300° K, and $I_S$ is commonly called the "saturation current" which is a basic scaling parameter for a BJT. (The thermal voltage has traditionally been indicated by $V_T$ in the literature, but the use of $V_K$ is generally being adopted to distinguish from the threshold voltage $V_T$ of a field-effect transistor.) In most practical situations, $I_C>>I_S$, so Equation 1 may be simplified by eliminating the +1 term from the argument of the ln function as follows:

$$V_{BE}\approx V_K\ln(I_C/I_S) \quad \text{(Eq. 2)}$$

The approximation of Equation 2 is generally valid for most operating conditions except at very low currents and high temperatures as described in more detail below. Therefore, Equation 2 and other mathematical relationships related to it may be written herein with an equal sign with the understanding that it is an approximation that is valid under most conditions.

Base-10 logarithms are commonly used to characterize the output of a log amp directly in terms of decibel (dB) changes in the input signal. It is also common to characterize the operation of a log amp in terms of a "slope voltage," defined as the amount of change in the output for each decade change in the input magnitude, and an "intercept," which is the value of input at which the extrapolation of the output in Equation 2 passes through zero. Therefore, using the expression $V_Y=V_K\ln(10)$ and substituting $I_X$ for $I_C$ and $V_{LOG}$ for $V_{BE}$, Equation 2 may be rearranged as follows:

$$V_{LOG}=V_Y\log_{10}(I_X/I_Z) \quad \text{(Eq. 3)}$$

where $V_{LOG}$ is the output voltage, $I_X$ is the input current, $V_Y$ is the slope voltage, and $I_Z$ is the intercept. From Equations 2 and 3, it is apparent that the log amp of FIG. 1 has a slope voltage $V_Y$ of $-V_K$ and an intercept $I_Z$ of $I_S$.

At any given calibration temperature, the circuit of FIG. 1 can provide a remarkably accurate measure of the logarithm of a fixed-polarity, constant or varying input current, and the op amp OA1 allows the output to be loaded while preserving accuracy. However, the saturation current $I_S$ is an extremely strong function of temperature, while the thermal voltage $V_K$ is proportional to absolute temperature (PTAT). Accordingly, further refinements are needed to ensure the calibration is essentially independent of temperature.

FIG. 2 illustrates a prior art elaboration of the Paterson diode connection providing a stable log-intercept through elimination of the temperature dependence of $I_S$. This scheme uses a second transistor Q2, nominally identical to Q1, and a second op amp OA2 configured as a unity-gain buffer (voltage follower) with its output fed back to its inverting (−) input terminal. With this topology, the output is the difference of the two base-emitter voltages:

$$V_{LOG} = -V_K\log(I_Z/I_S) + V_K\log(I_X/I_S) \quad \text{(Eq. 4a)}$$

$$= V_K\log(I_X/I_Z) \quad \text{(Eq. 4b)}$$

$$= V_Y\log_{10}(I_X/I_Z) \quad \text{(Eq. 4c)}$$

where the inputs have been swapped to make $V_{LOG}$ turn out positive. Therefore, the uncertain value of $I_S$ has been eliminated, and the intercept is now determined by the reference current $I_Z$ which, using well-known techniques, can be supplied by an accurate and temperature-stable current source. This scheme offers "log-ratio" operation.

The logarithmic output $V_{LOG}$ still has a temperature-dependent slope $V_K$=kT/q, alternatively written $V_Y$=(kT/q)log (10). Temperature compensation of the slope is typically achieved through the use of an analog multiplier as shown in FIG. 3. A translinear multiplier cell 10 is used to form the feedback loop with the logging transistors Q1 and Q2. The temperature compensation of the slope is achieved by using a PTAT current $I_t$, and a temperature-stable current $I_r$ for biasing the two halves of the multiplier cell. This circuit and further refinements are described more fully in U.S. Pat. No. 4,604,532, by the same inventor as the present patent disclosure.

FIG. 4 illustrates another prior art logarithmic circuit that operates on the same fundamental principles as the Patterson diode, but with the emitter of the log transistor referenced to a ground node. The base of Q1, from which the logarithmic output signal $V_{BE}$ is taken, is driven by a differential-input amplifier 14, preferably a high-gain, FET-input operational amplifier (op amp), which has its noninverting (+) input coupled to the collector of Q1 and its inverting (−) input coupled to a voltage $V_{SUM}$ that sets the voltage at the input ("summing") node.

As with a Patterson diode arrangement, the circuit of FIG. 4 can be combined with a reference cell to form a differential-output, log-ratio circuit, as shown in FIG. 5. The reference cell is implemented with a second log transistor Q2 having its emitter grounded and its collector arranged to receive a second input current $I_2$. A second amplifier 16 has its noninverting (+) input coupled to the collector of Q2 and its inverting (−) input coupled to the same reference voltage $V_{SUM}$ as the first amplifier 14. In this embodiment, amplifiers 14 and 16 are preferably high-gain op amps, and $V_{SUM}$ is typically 0.5 volts. The logarithmic output signal $\Delta V_{BE}$ is taken as the difference between the base voltages of Q1 and Q2 and behaves according to the following equation:

$$\Delta V_{BE}=V_{BE1}-V_{BE2}=V_K\log(I_1/I_2) \quad \text{(Eq. 5)}$$

If the second input current $I_2$ is stable with temperature, and transistors Q1 and Q2 are isothermal and nominally identical, the circuit of FIG. 5 provides a log amp in which the intercept has been temperature stabilized. That is, the highly temperature and process dependent saturation current $I_S$ for Q1 cancels the $I_S$ of Q2, so the intercept depends only on the value of $I_2$. The temperature variability in the slope remains, introduced by the thermal voltage $V_K$=kT/q in Equation 5. This remaining temperature-dependency can be eliminated by using a translinear multiplier cell to implement the temperature compensation of the thermal voltage $V_K$ in Equation 5, thereby stabilizing the slope. The second input terminal in the circuit of FIG. 5 can also be used to realize log-ratio operation rather than a log amp having a fixed intercept. This circuit and further refinements are described more fully in U.S. Pat. No. 7,310,656 by the same inventor as the present patent disclosure.

DETAILED DESCRIPTION

The log amps described above with respect to FIGS. 1-5 are known as translinear log amps because they exploit the reliable logarithmic relation between the collector current ($I_C$) and the base-emitter voltage ($V_{BE}$) of a bipolar junction transistor (BJT). This relationship remains accurate for input signals that vary over many orders of magnitude (or decades when expressed in decibel (dB) notation).

A limitation of the translinear log amps described above, however, is that they tend to have limited bandwidth, especially at low input currents where the circuit becomes progressively slower as the collector current decreases.

At the low end of the operating range, the bandwidth of a translinear log amp is typically determined by the collector current $I_C$ and the capacitance at the collector terminal. This may be understood with reference to FIG. 6 which illustrates the collector-junction capacitance ($C_{JC}$) and the incremental emitter resistance ($r_e$) of the logging transistor Q1 of FIG. 4. The incremental emitter resistance is:

$$r_e = \frac{kT}{qI_C} \quad \text{(Eq. 6)}$$

where kT/q is the thermal voltage $V_K$ which is ≈26 mV at 300K. (The thermal voltage has traditionally been indicated by $V_T$ in the literature, but the use of $V_K$ is generally being adopted to distinguish from the threshold voltage $V_T$ of a field-effect transistor.)

Figure 6:
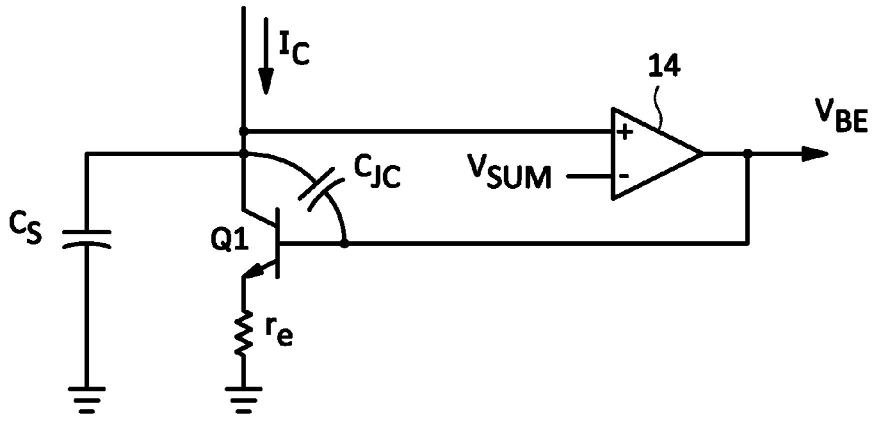

When the base is driven as shown in FIG. 6, the collector-junction capacitance and the incremental emitter resistance form a time constant $\tau_6$ which is given by:

$$\tau_6 = C_{JC} r_e \quad \text{(Eq. 7)}$$

The log amp then has a resulting cutoff (−3 dB) frequency $f_C$ which is given by:

$$f_c = \frac{1}{2\pi\tau_6} \quad \text{(Eq. 8)}$$

From Equation 6, it is apparent that the emitter resistance $r_e$ takes on very high values at low input current levels. For example, at 100 pA of collector current, $r_e = 2.6 \times 10^{-8}$ ohms, or 260 MΩ. Assuming a junction capacitance of 0.3 pF, Equations 7 and 8 indicate a bandwidth of about 2 KHz. Attempting to reduce the input current to 1 pA would increase $r_e$ to an extremely high value of 26 GΩ and reduce the bandwidth to about 20 Hz. Similar loop dynamics apply to the Patterson diode configuration of FIG. 1. Thus, 100 pA is typically about the lower limit of usable input currents for commercially available translinear log amps. This, in turn, limits the overall dynamic range of the log amp.

FIG. 6 also illustrates a stray capacitance $C_S$ which may represent the capacitance of a cable used to connect the log amp to a sensor, the capacitance of a photo diode detector, etc. This stray capacitance may further degrade the frequency response of the log amp.

Logarithmic Circuit with Separate Feedback Loops

Figure 7:
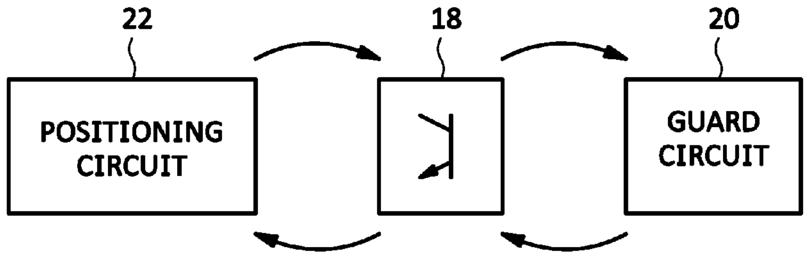
FIG. 7 illustrates an embodiment of a logarithmic circuit according to some inventive principles of this patent disclosure.

FIG. 7 illustrates an embodiment of a logarithmic circuit according to some inventive principles of this patent disclosure. The embodiment of FIG. 7 includes a logging transistor 18 which may be any device that exhibits a logarithmic relationship between input and output signals. A guard circuit 20 is arranged in a first feedback loop with the logging transistor to prevent inaccuracies due to variation of one or more signals. A positioning circuit 22 is arranged in a second feedback loop with the logging transistor to maintain one or more circuit parameters at a suitable operating point.

Figure 8:
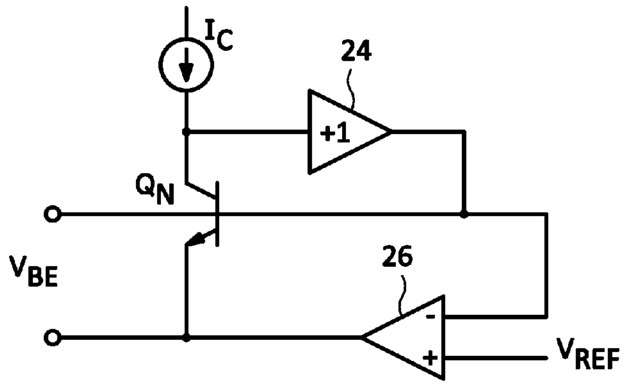
FIG. 8 illustrates another embodiment of a logarithmic circuit according to some inventive principles of this patent disclosure.

FIG. 8 illustrates some example details that may be used to implement the circuit of FIG. 7 according to some inventive principles of this patent disclosure. In the embodiment of FIG. 8, the logging transistor is realized as a bipolar junction transistor (BJT) $Q_N$. The guard circuit is implemented with a buffer amplifier 24 having an input connected to the collector of $Q_N$ and an output arranged to drive the base of $Q_N$. The buffer amplifier may be realized, for example, as an operational amplifier (op-amp) having its noninverting (+) input connected to the collector of $Q_N$ and its output connected back to its inverting (−) input in a unity gain (+1) configuration.

The positioning circuit may also be implemented with an op-amp 26 which, in the example of FIG. 8, has its inverting (−) input connected to the base of $Q_N$, its noninverting (+) input arranged to receive a reference voltage $V_{REF}$ and its output arranged to drive the emitter of $Q_N$.

The guard circuit has a very high input impedance and drives the base in a manner that forces all of the input current $I_C$ to flow into the collector of $Q_N$. With all of the input current guided into the collector of $Q_N$, the base-emitter voltage of $Q_N$ varies solely as the logarithm of the input current $I_C$. The positioning circuit drives the emitter of $Q_N$ to maintain the voltage at the collector node of $Q_N$ at $V_{REF}$. The output $V_{BE}$ is obtained from the base-emitter junction of $Q_N$.

Figure 1:
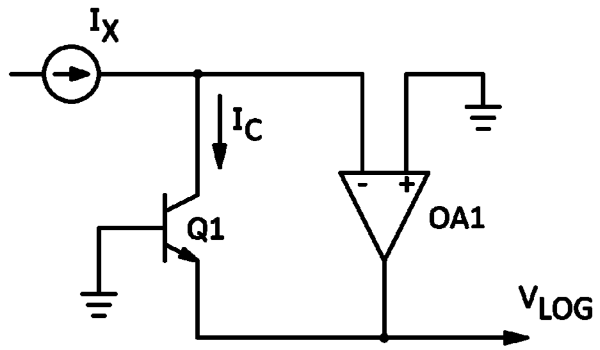
FIG. 1 (PRIOR ART)
FIGS. 1 through 6 illustrate prior art logarithmic circuits.
Figure 2:
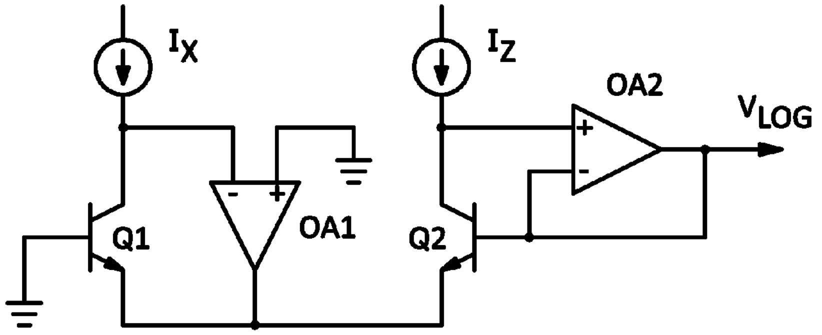
FIG. 2 (PRIOR ART)
Figure 3:
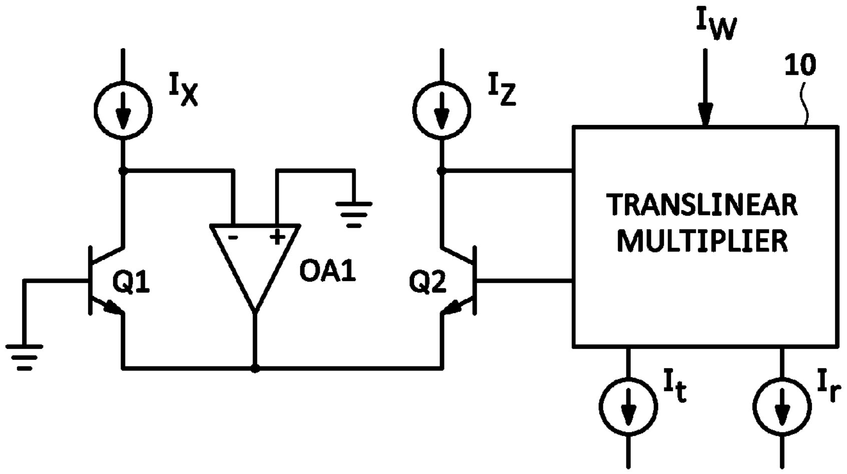
FIG. 3 (PRIOR ART)
Figure 4:
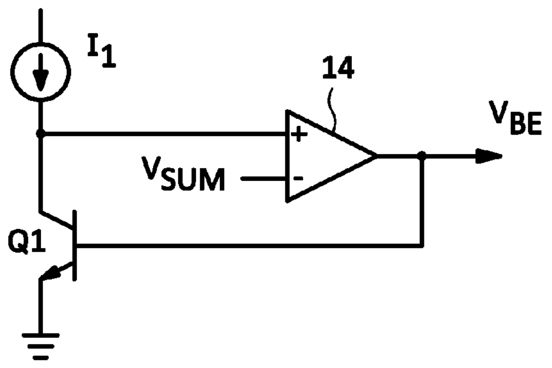
FIG. 4 (PRIOR ART)
Figure 5:
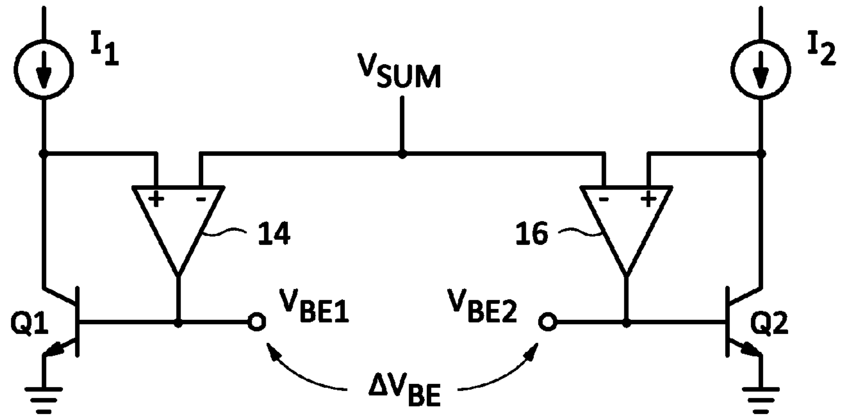
FIG. 5 (PRIOR ART)

The operation of the embodiment of FIG. 8 may be better understood by first examining the operation of the prior art circuits described above. In the circuits of FIGS. 1 and 4, the op-amp OA1 actually performs two separate functions which may not be readily apparent. First, it attempts to force all of the input current $I_C$ into the collector of Q1. Second, it attempts to maintain the collector of Q1 at a fixed potential. However, as explained above with respect to FIG. 6, the loop dynamics may degrade the operation of the circuit. For example, rather than flowing into the collector of Q1, some of the input current $I_C$ may be diverted to the base node in the form of displacement currents flowing through the collector-junction capacitance $C_{JC}$.

By splitting these two functions into separate loops, the embodiment of FIG. 8 may provide improved performance. For example, referring to FIG. 6, the time constant $\tau_6$, as set forth in Equation 7 above, is determined by the product of $r_e$ and the collector-junction capacitance $C_{JC}$. However, in the embodiment of FIG. 8, the guard circuit (which includes buffer amp 24) is arranged in a manner that maintains the collector-base voltage at a constant potential, thereby reducing or eliminating the effects of $C_{JC}$. With the collector-junction capacitance $C_{JC}$ essentially cancelled, the time constant is now determined by the product of $r_e$ and the emitter-junction capacitance $C_{JE}$, which is typically much smaller than the collector-junction capacitance $C_{JC}$. Thus, the time constant $\tau_8$ for the embodiment of FIG. 8 is:

$$\tau_8 = C_{JE} r_e \quad \text{(Eq. 9)}$$

The reduced time constant provides a correspondingly higher cutoff frequency and bandwidth. Depending on the implementation details and operating conditions, the bandwidth improvement may be measured in orders of magnitude.

With the collector-base voltage essentially nulled by the guard circuit, the collector-emitter voltage of $Q_N$ also changes logarithmically in response to the input current. Therefore, the positioning circuit, which in the example of FIG. 8 is implemented with op-amp 26, drives the emitter of $Q_N$ to maintain the collector node at $V_{REF}$. Maintaining the collector node at a fixed potential may be beneficial in applications where the source of the input current $I_C$ is sensitive to voltage variations at the input node. It may also reduce or eliminate adverse effects from the capacitance of the source of the input current, or any stray capacitance from cabling or the like that may be present at the collector node of $Q_N$.

The dual-loop arrangement of FIG. 8 may also provide flexibility in the positioning of the various transistor terminals relative to one or more power supply voltages. For example, in a single supply embodiment, $V_{REF}$ may be set to about 1 volt above ground to assure that the emitter of $Q_N$ always remains at least about 200 mV above ground. In such an embodiment, the op amp 24 maybe implemented with an output having high current sinking capability. Alternatively, in a dual-supply embodiment, $V_{REF}$ may be set to power supply common (zero volts, or ground), while the emitter of $Q_N$ takes on a negative voltage.

Figure 9:
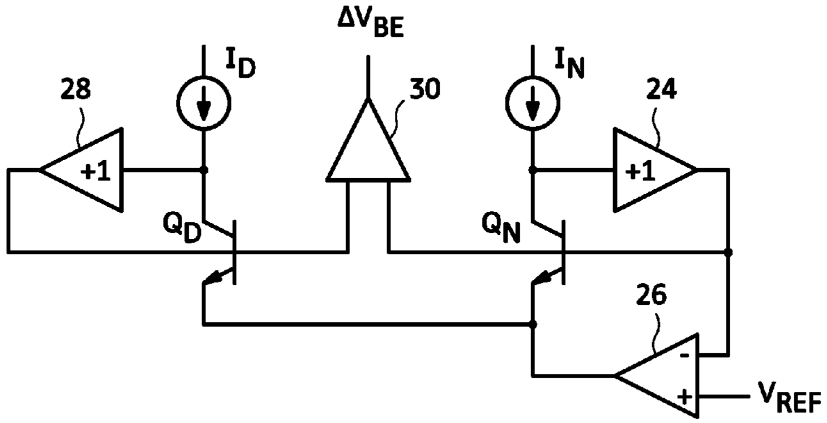
FIG. 9 illustrates another embodiment of a logarithmic circuit according to some inventive principles of this patent disclosure.

FIG. 9 illustrates another embodiment of a logarithmic circuit according to some inventive principles of this patent disclosure. The embodiment of FIG. 9 includes a logging transistor $Q_N$ with dual feedback loops as in the embodiment of FIG. 8, but also includes a second logging transistor $Q_D$ arranged to provide log-ratio operation with the input current $I_N$ to $Q_N$ providing the numerator, and the input current $I_D$ to $Q_D$ providing the denominator. The base of transistor $Q_D$ is driven by another buffer amplifier 28 which, in this embodiment, is configured as a unity gain amplifier. The output is in the form of the differential base-emitter voltage VBE between $Q_N$ and $Q_D$ which may be buffered by differential amplifier 30.

The embodiment of FIG. 9 may be configured for single-ended operation with a reference current applied to one of the inputs and the measured signal applied to the other input, or it may be configured for log-ratio operation with the two inputs applied as $I_N$ and $I_D$. If properly matched transistors are used for $Q_N$ and $Q_D$, the log-intercept is stabilized through the elimination of the temperature dependency of $I_S$. The slope may also be temperature compensated through any suitable technique include any of the PTAT-to-ZTAT conversion techniques described below.

Adaptive Compensation

Another factor that tends to limit the bandwidth of a translinear log amp is the need for a compensation network to stabilize the circuit at higher operating frequencies. The feedback path through Q1 in the circuits of FIGS. 1 and 4 has a very high voltage gain. Under some operating conditions, the polarity of the feedback may actually change and cause positive feedback. At high frequencies, the incremental emitter resistance $r_e$ and stray capacitance $C_S$ form an additional pole. Moreover, a typical op-amp is designed to be stable only down to unity gain by direct connection of the output back to the inverting input. Thus, the inclusion of additional voltage gain in the feedback path tends to de-stabilize the loop.

Figure 10:
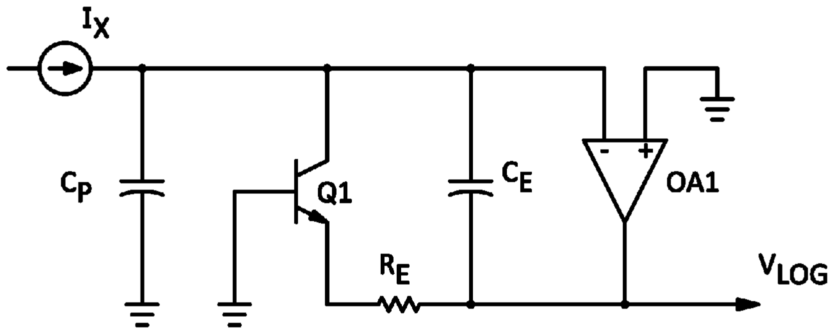
FIG. 10 (PRIOR ART)
FIGS. 10 and 11 illustrate prior art techniques for providing high-frequency stabilization to a translinear log amp.

FIG. 10 illustrates a prior art technique for providing high-frequency (HF) stabilization to a translinear log amp. Capacitor $C_E$ and resistor $R_E$ essentially act to limit the feedback gain at high frequencies. $R_E$ is chosen so that the maximum negative output from OA1 can still support the largest input current. At the upper end of the input range $R_E >> r_e$ and the time constant formed by these components is very close to $C_E R_E$. At a value of $I_x = V_K/R_E$, the time-constant is doubled. At very low currents, it becomes $C_E r_e$. To prevent resonance, damping must be included, which tends to reduce the bandwidth of the overall system. Moreover, a translinear log amp is inherently slow for small input currents as explained above, and the HV compensation network further degrades frequency response at the low end.

Figure 11:
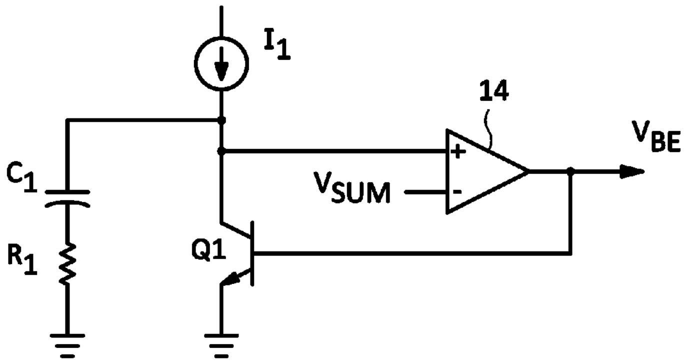
FIG. 11 (PRIOR ART)

Another prior art HF stabilization scheme used with the circuit of FIG. 4 is shown in FIG. 11. The user includes an HF stabilization network including R1 and C1, which are typically external components, to stabilize the system over the full range of expected input currents and operating frequencies. This generally involves trial and error to select the optimum component values for a given application. More optimum values may be determined for smaller subranges, but if the circuit must operate over a relatively wide input range, tradeoffs between performance and stability at different input currents and operating frequencies may reduce the overall performance of the system.

Figure 12:
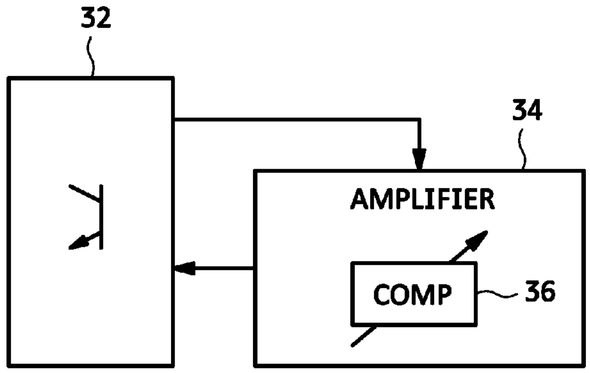
FIG. 12 illustrates an embodiment of a logarithmic circuit having compensation according to some inventive principles of this patent disclosure.

FIG. 12 illustrates an embodiment of a logarithmic circuit having compensation according to some inventive principles of this patent disclosure. The embodiment of FIG. 12 includes one or more logging transistors 32 and an amplifier 34 which includes adaptive compensation 36 to stabilize the circuit by providing compensation that varies in response to an operating parameter of the logging transistor. A typical implementation of the adaptive compensation may vary the compensation in response to the input current to the logging transistor, but the adaptive compensation may also respond to temperature, frequency and/or other parameters.

The logging transistors 32 may be arranged as a Patterson diode, a grounded emitter transistor, a dual-loop configuration as described above, or any other suitable configuration.

Figure 13:
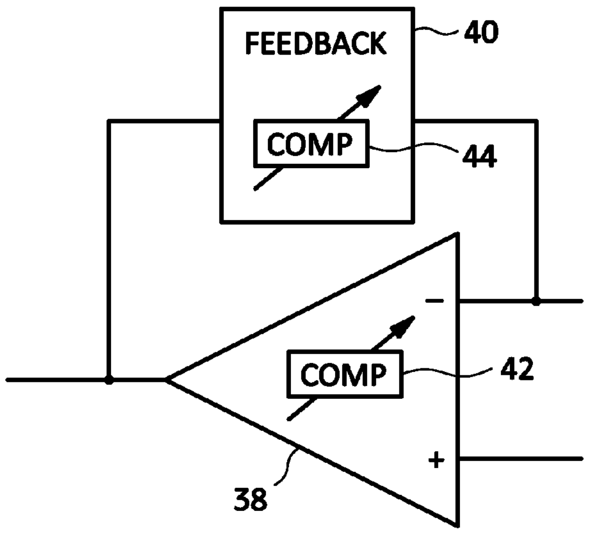
FIG. 13 illustrates another embodiment of a logarithmic circuit having compensation according to some inventive principles of this patent disclosure.

The amplifier 34 and adaptive compensation 36 are not limited to any specific arrangement, but FIG. 13 illustrates an example embodiment of an amplifier suitable for use in the circuit of FIG. 12. The embodiment of FIG. 13 includes an operational amplifier 38 having a feedback network 40. Variable compensation elements 42 and 44 may be included internally in the op amp and/or as part of the feedback network. In other embodiments, one or more variable compensation elements may be included in series with the input and/or output of the op amp, or in any other suitable place in the circuit. In a typical implementation, the variable compensation elements may be realized as capacitors and/or other filter elements arranged to provide a frequency response that varies with the input current to the logging transistor, but the inventive principles are not limited to these details.

Figure 14:
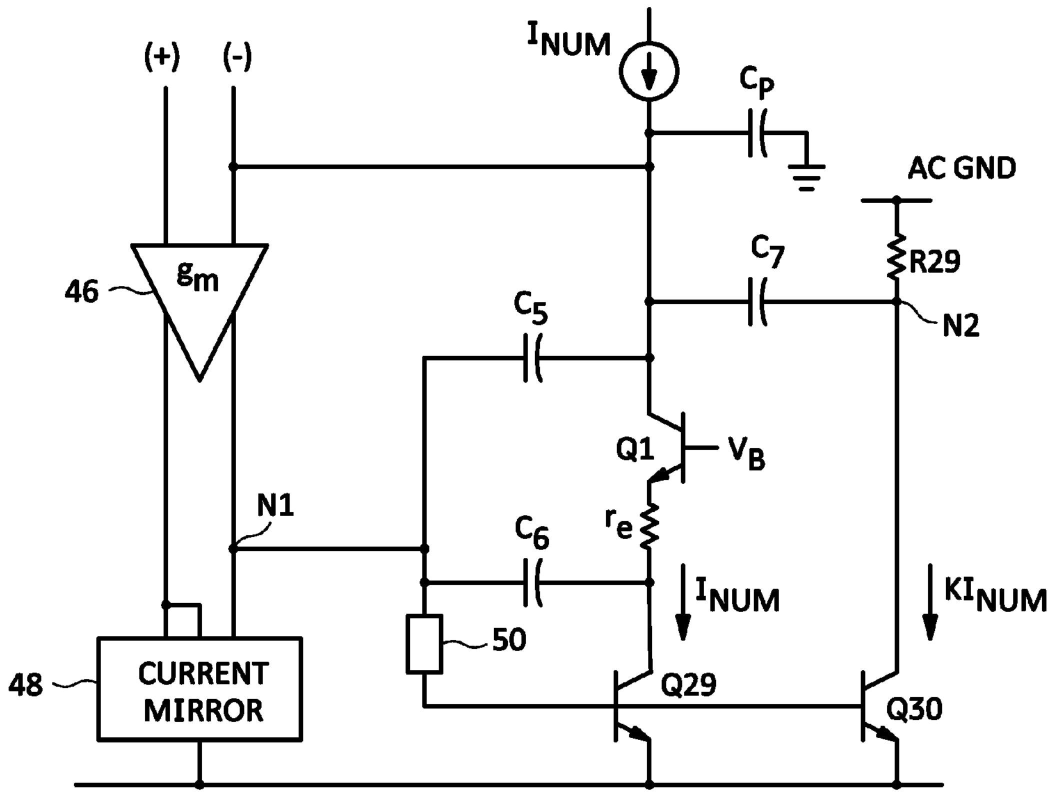
FIG. 14 illustrates an embodiment of an adaptive compensation amplifier showing some example implementation details according to the inventive principles of this patent disclosure.

FIG. 14 illustrates an embodiment of an adaptive compensation amplifier showing some example implementation details according to the inventive principles of this patent disclosure. In the embodiment of FIG. 14, the op amp includes an input stage having a transconductance ($g_m$) cell 46 loaded by a current mirror 48. An intermediate stage 50 drives an output transistor Q29 in response to the single-ended output signal from the input stage at node N1. Transistor Q29 provides a current sink for the logging transistor Q1. The collector of Q1 is connected back to the inverting (−) input of the op amp, thereby forming a feedback loop that forces all of the input current $I_{NUM}$ into the collector of Q1. A first compensation capacitor C5 is connected between the collector of Q1 and node N1, while a second compensation capacitor C6 is connected between the collector of Q29 and node N1.

Operational amplifiers typically include internal compensation capacitors to assure stable operation down to unity gain. The embodiment of FIG. 14 includes capacitors C5 and C6 which compensate the op amp, but which are arranged to vary the compensation in response to the current through the logging transistor. This can be understood by considering the electronic emitter resistance $r_e$ of the logging transistor Q1. When the input current $I_{NUM}$ through Q1 is large, $r_e$ is small, and the influence of C6 is minimal because there is little voltage variation at the collector of Q29. Thus, the compensation is determined primarily by C5 which provides the dominant pole compensation.

At lower values of $I_{NUM}$, however, $r_e$ becomes very large, and the feedback through C5 becomes weak, so the compensation is determined primarily by C6. Thus, as the input current is swept through its operating range, the compensation function is handed off between the two capacitors which may be selected so the roll-off (−3 dB) point of the op amp is positioned at a suitable frequency for any given current level.

The embodiment of FIG. 14 includes an additional adaptive compensation path through transistor Q30, capacitor C7 and resistor R29. The base and emitter Q30 are connected in parallel with the base and emitter of Q29 so the collector current through Q30 is a scaled replica of the current through Q29. If the relative emitter areas of Q29 and Q30 are scaled by a factor K, the current through Q30 is $KI_{NUM}$. In a typical implementation, K may be a fractional value less than one so Q30 operates at a much lower current than Q29. The current $KI_{NUM}$ is applied to R29 which is anchored to an AC ground, for example, a power supply rail. Capacitor C7 is connected between the collector of Q1 and a node N2, which is located between the collector of Q30 and R29.

This additional compensation path provides a nonlinear HF correction that tracks the input current to compensate for the loop dynamics that change with the value of $I_{NUM}$. As $I_{NUM}$ increases, $KI_{NUM}$ increases, thereby causing the voltage at node N2 to change linearly with $I_{NUM}$, which, in turn, provides additional HF current feedback through C7 to the input of the op amp. That is, as $I_{NUM}$ increases, the voltage gain from the base to the collector of Q30 becomes progressively larger, so the compensation effect of C7 becomes progressively stronger. The magnitude of the $r_e$ of Q30 varies in response to the value of $I_{NUM}$ to provide a feedback component that is proportional to $I_{NUM}$. Thus, at moderate and lower currents, the $r_e$ of Q30 becomes relatively large and the influence of the feedback path through C7 is reduced or eliminated.

As with the compensation paths through C5 and C6, the components in the additional compensation path through C7 may be rearranged within the scope of the inventive principles. For example, in some other embodiments, the compensation capacitor C7 may be connected to node N1.

By varying the compensation in response to the input current, the inventive principles relating to adaptive compensation may enable a logarithmic circuit to preserve bandwidth at the lower end of the operating range while ensuring stability at the high end. The adaptive compensation may be arranged to limit the phase around the loop including the logging transistor to a point where the system has good phase margin under all operating conditions. Moreover, the inventive principles relating to adaptive compensation may eliminate or reduce the need for a dedicated compensation circuit that typically requires additional components and may need to be customized for a particular application.

Figure 15:
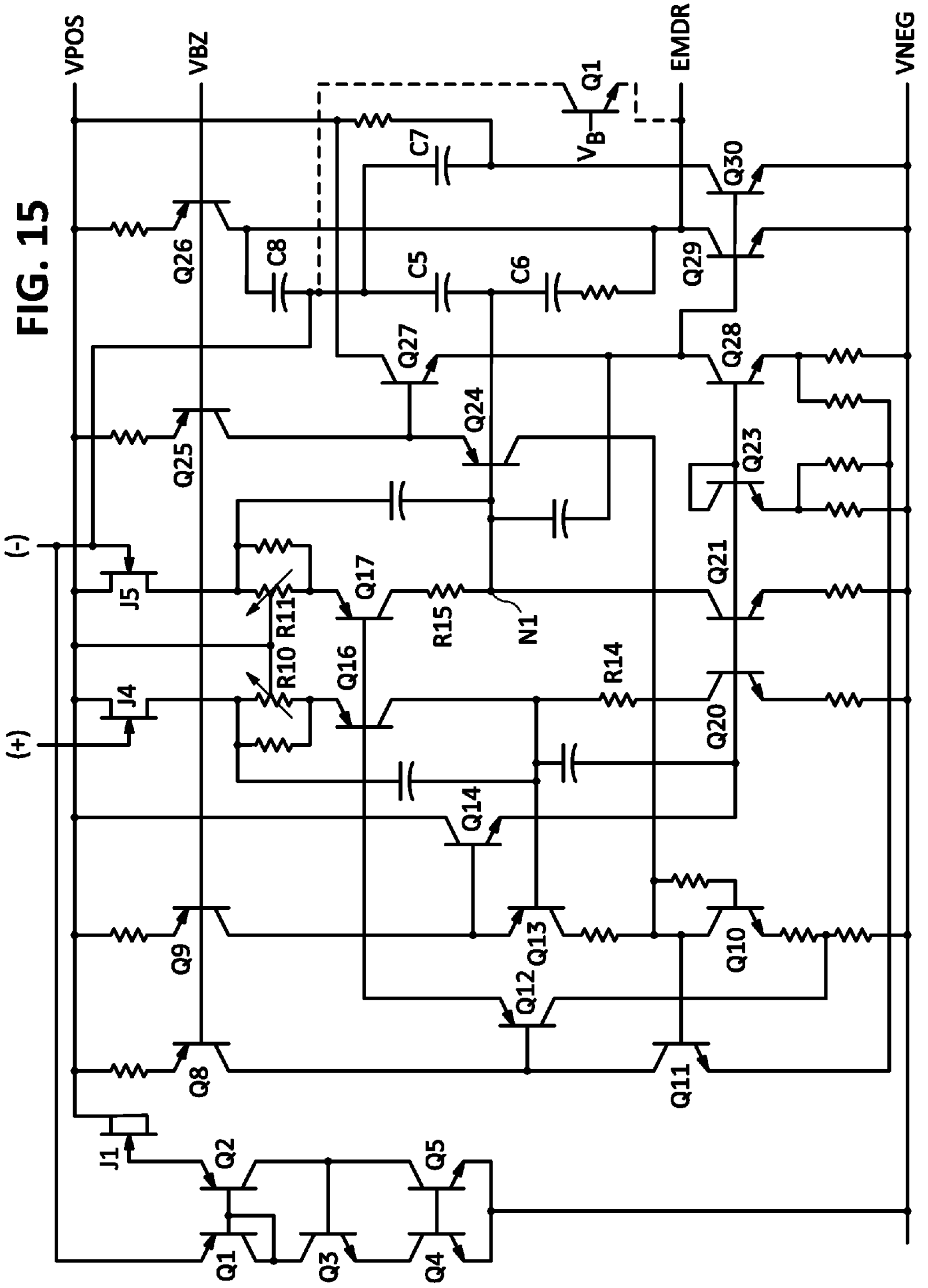
FIG. 15 illustrates another embodiment of an adaptive compensation amplifier showing some additional example implementation details according to the inventive principles of this patent disclosure.

FIG. 15 illustrates another embodiment of an adaptive compensation amplifier showing some additional example implementation details according to the inventive principles of this patent disclosure. In the embodiment of FIG. 15, the op amp is implemented as an electrometer-grade amplifier with an input stage with a gm cell having JFET inputs and a current minor load formed by NPN transistors Q20 and Q21. The gm cell includes JFET input transistors J4 and J5 and PNP transistors Q16 and Q17. The output signal from the input stage is taken at node N1 between the collectors of Q21 and Q17.

Transistors Q8, Q9, Q25 and Q26 provide bias currents in response to bias voltage $V_{BZ}$. Transistor Q12 drives the bases of the PNP transistors Q16 and Q17 in the gm cell. The base connection to the mirror transistors Q20 and Q21 is provided by a first emitter-follower transistor Q14 and a second emitter-follower transistor Q13 to minimize input currents to the current minor Q20 and Q21. Transistor Q24, which forms a drive stage with Q27 as explained below, is matched with Q13 to provide symmetry. Transistors Q24 and Q13 are both biased by zero temperature coefficient currents and their base currents cancel to provide improved accuracy.

Transistor Q24 forms an intermediate stage with Q27 which, in turn, forms what may be described as a super Darlington with Q29 to provide adequate base drive to Q29 which must sink all of the current through the logging transistor Q1 at the high end of the measurement range.

Transistors Q29 and Q30 and capacitors C5-C7 operate as described above with respect to FIG. 14. To provide maximum accuracy at the op amp inputs, the offset may be trimmed with resistors R10 and R11, while the arrangement including JFET J1 and the accompanying circuitry Q1-Q5 provide gate current cancellation. In a typical implementation, the input JFETS and PNPs and the current mirror transistors may be realized with matched and cross-quadded transistors.

Hyper-Tanh

In a translinear log amp, the use of a second logging transistor converts the output to a log-ratio form which may be used to remove the temperature dependency of the log-intercept. The resulting log-ratio output, however, still includes a temperature dependent slope voltage that is PTAT. Prior art systems typically use a translinear multiplier cell inside the control loop to remove the temperature dependency of the slope. A prior art translinear multiplier may provide adequate PTAT-to-ZTAT conversion in log amps with moderately wide dynamic range, but as the usable dynamic range is pushed to greater levels, it becomes increasingly difficult to accommodate the entire signal range with a multiplier cell having only a +/−50 mV input range. Offset voltages, for example, may degrade or destroy the accuracy of the temperature compensation.

Some additional inventive principles of this patent disclosure relate to PTAT-to-ZTAT converters that utilize a multiplicity of tanh cells arranged to provide a wide input signal range and improved noise performance. Transistor cells that utilize more than one tanh cell to increase the linear input range of an amplifier are known as multi-tanh cells. Second and third-order multi-tanh cells (i.e., cells that include two or three tanh cells, respectively), and even some fourth-order cells, are known and used in various applications. The utility of higher-order multi-tanh cells, however, has been questioned. See, e.g., B. Gilbert, *The Multi-Tanh Principle: A Unified Overview,* 1997, page 2.

The inventive principles of this patent disclosure contemplate the use of multi-tanh circuits having large numbers of tanh cells, that is, in some embodiment, about nine or more cells, and in some other embodiments about twelve or more tanh cells. These circuits will be referred to as hyper-tanh circuits to distinguish them from the more simplistic, lower-order multi-tanh cells.

Figure 16:
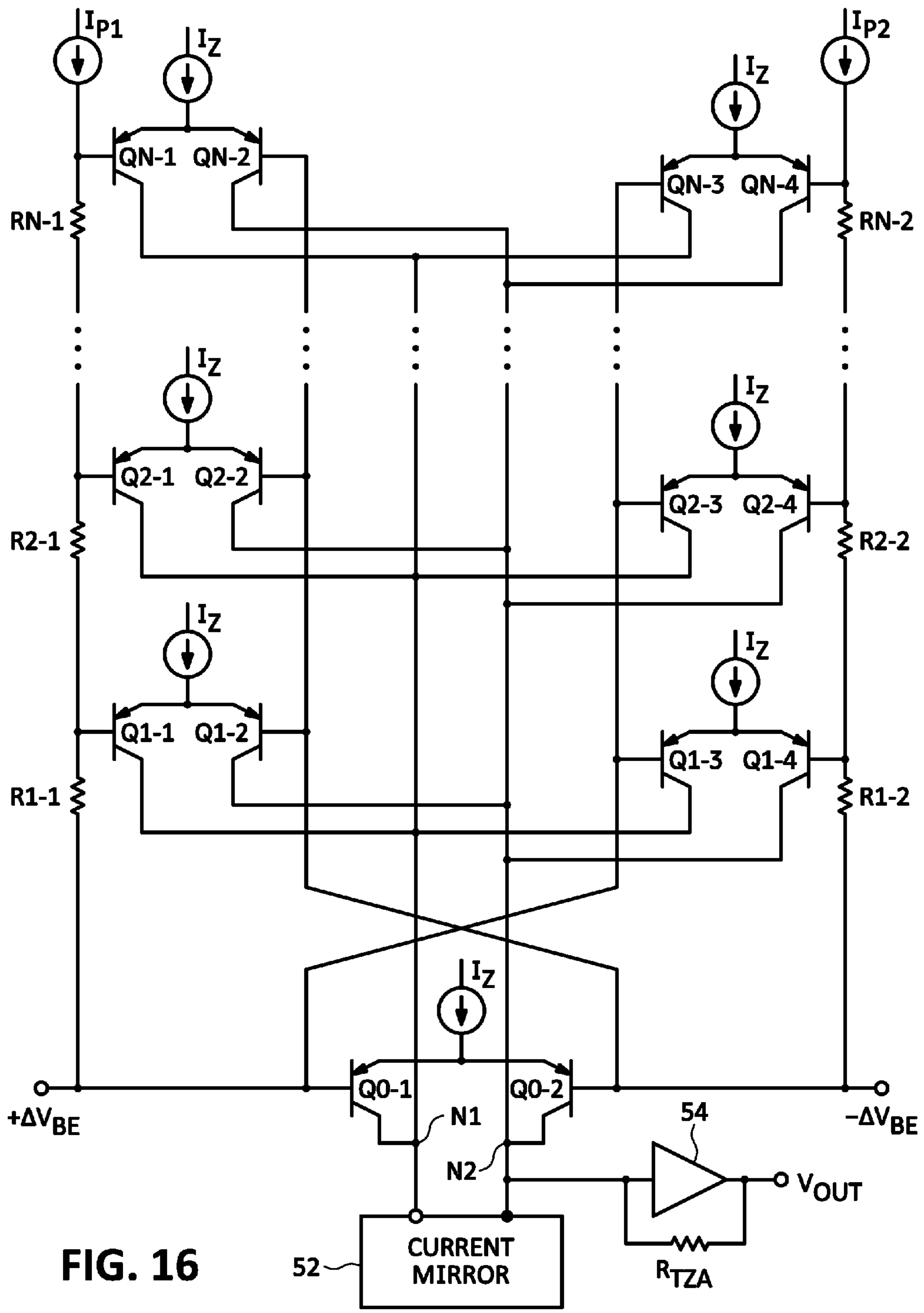
FIG. 16 illustrates an embodiment of a hyper-tanh circuit according to some inventive principles of this patent disclosure.

FIG. 16 illustrates an embodiment of a hyper-tanh circuit according to some inventive principles of this patent disclosure. This embodiment may be used, for example, as a PTAT-to-ZTAT converter for any of the translinear log amps described above. The inventive principles, however, are not limited to these details or applications.

Referring to FIG. 16, the output from the log cell is applied to the hyper-tanh circuit as a differential voltage-mode signal at the $+/-\Delta V_{BE}$ terminals. This input signal is applied directly to a central tanh cell Q0-1 and Q0-2. The input signal is also applied to additional pairs of tanh cells such as Q1-1 through Q1-4 and Q2-1 through Q2-4 which are arranged with equal and opposite offsets from the central tanh cell. The additional pairs can be visualized as a stack in which the pair of tanh cells in each layer (or stage) of the stack has progressively greater offsets from the central tanh cell. The tail currents $I_Z$ applied to the tanh cells are temperature stable ZTAT currents.

In one example embodiment, the number of stages N stacked above the central tanh cell Q0-1, Q0-2 may be 9, and thus, the hyper-tanh circuit includes a total of 2N+1=19 tanh cells. However, any number of cells greater than about 12 may be used.

The offsets are provided by resistor strings R1-1, R2-1 . . . RN-1 and R1-2, R2-2 . . . RN-2, which are driven by PTAT current sources $I_{P1}$ and $I_{P2}$. The differential outputs from all of the tanh cells are summed at nodes $N_1$ and $N_2$ and applied to a current minor 52, which is preferable of the low drop-out type known as a V-mirror where the input terminal shown with a circle outline indicates the "input" or diode-connected side, while the input terminal shown with a solid dot indicates the "output" side of the minor. The output is provided by a transimpedance amplifier (TZA) 54 which converts the output current from node $N_2$ to a voltage $V_{OUT}$.

One advantage of a hyper-tanh circuit stems from the recognition that the differential output from the log cell is in precisely the right form to be applied to a differential pair of transistors. This simplifies implementation of the individual cells because now only a ZTAT current is required rather than both PTAT and ZTAT currents as in prior art multiplier circuits used for temperature compensating the slope of a log amp.

Another advantage is that a wide input signal range, e.g., 200 dB, may be distributed across many cells. A further advantage is the reduction in noise that may result from the use of a multiplicity of tanh cells. This is because each individual cell only contributes noise in the portion of the signal range in which it is active, then contributes no noise when it is off. Thus, the compensation circuit has the benefit of the very large dynamic range afforded by having many tanh cells, but the noise is never greater than that provided by a single tanh cell.

The inventive principles relating to hyper-tanh circuits are not limited to the details described above. The tanh cells may be series-connected, parallel-connected, or arranged in a hybrid configuration. The tanh cells may include simple gm cells as shown in FIG. 16, or other, more complex cells. The use of an odd number of cells enables one of the cells to be positioned at the center of the input voltage range, but even numbers of cells may be used, and the entire hyper-tanh circuit need not be arranged symmetrically around the zero input point.

Figure 17:
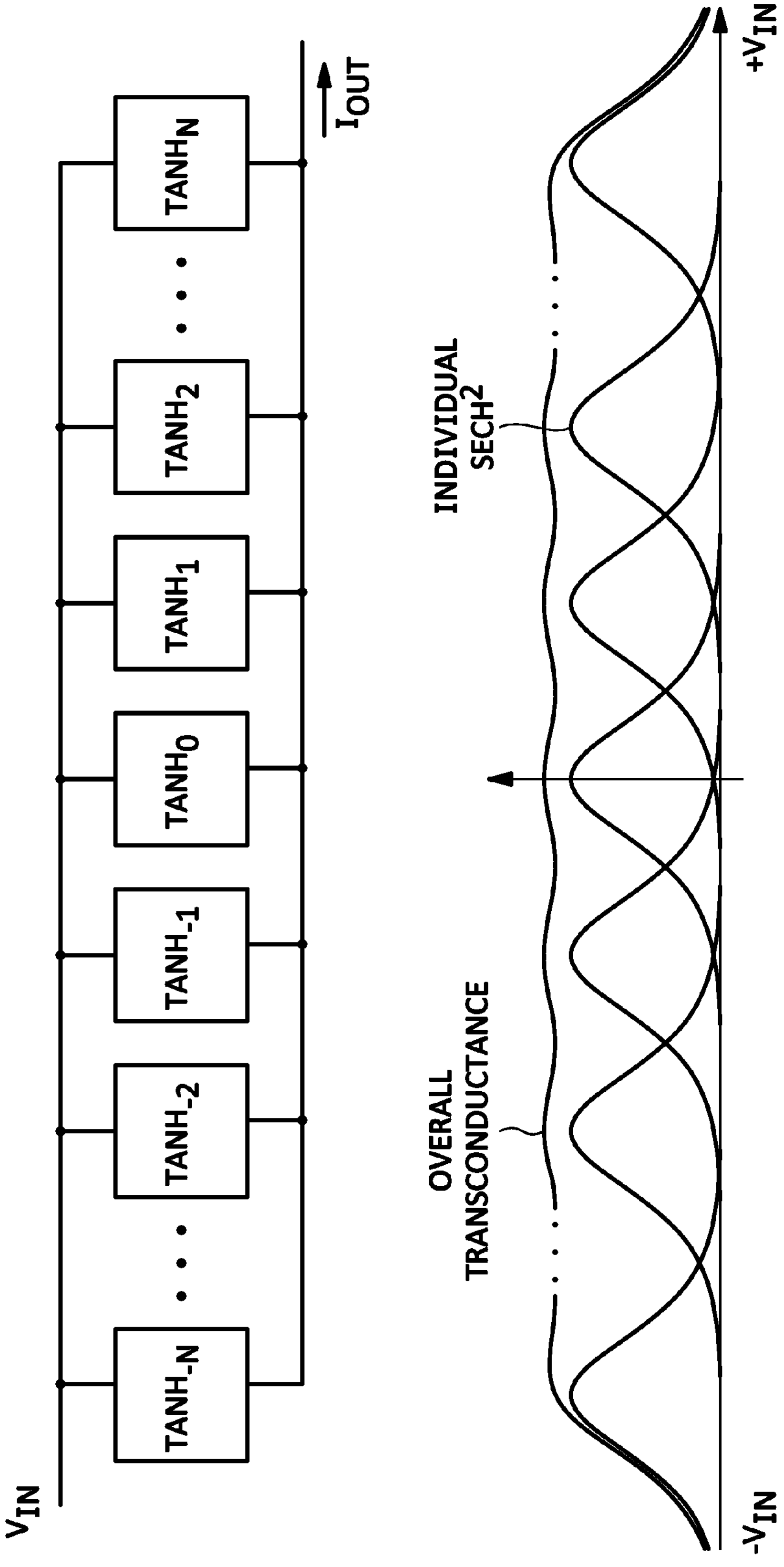
FIG. 17 illustrates another embodiment of a hyper-tanh circuit according to some inventive principles of this patent disclosure.

FIG. 17 illustrates a more general embodiment of a hyper-tanh circuit showing that the tanh cells $TANH_0$-$TANH_{\pm N}$ can be arranged in any suitable manner that distributes the input ranges of the individual cells along the input signal axis, which in this example is shown as $V_{IN}$. The trace below the cells shows the $sech^2$ incremental transconductance of each tanh cell which contributes to the overall transconductance of the hyper-tanh circuit. The $sech^2$ curves are not necessarily shown to scale, and the ripple in the composite curve is exaggerated to show the effects of the individual cells. Depending on the implementation details, the linear input range of a hyper-tanh circuit may extend to hundreds of millivolts and beyond.

Multi-Tanh PTAT-ZTAT Converter

Figure 18:
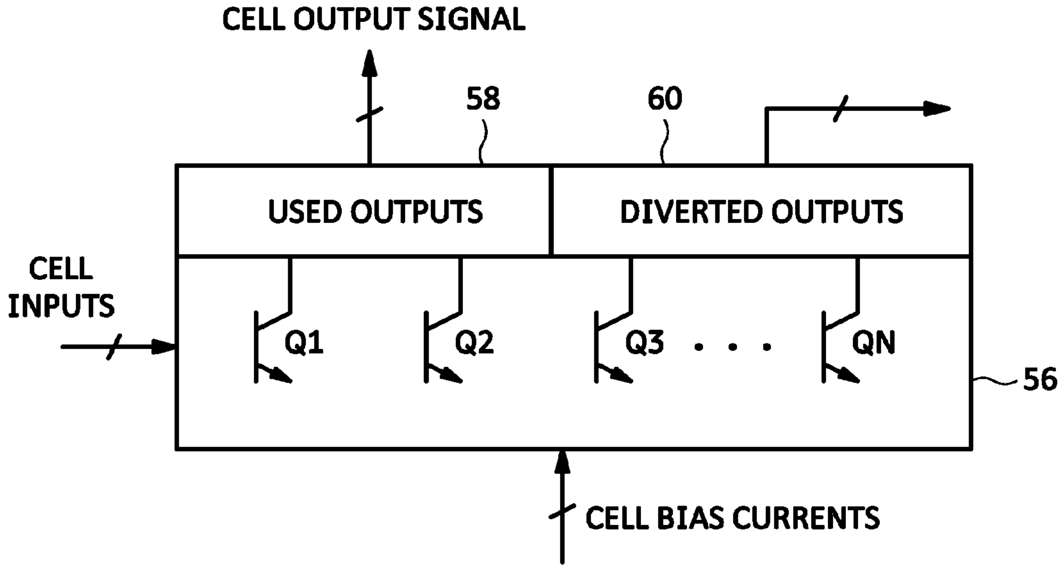
FIG. 18 illustrates an embodiment of a multi-tanh PTAT-to-ZTAT converter according to some inventive principles of this patent disclosure.

FIG. 18 illustrates another embodiment of a PTAT-to-ZTAT converter according to some inventive principles of this patent disclosure. The embodiment of FIG. 18 includes a multi-tanh cell 56 in which the output signal is taken from fewer than all of the transistors. The transistors Q1-QN may be arranged in any suitable multi-tanh configuration including a parallel connection, series connection, hybrid connection, etc., with or without a common emitter connection. The transistors may be biased by one or more bias currents. The outputs from some of the transistors are routed through one or more output nodes 58 and used as the actual signal output or outputs of the cell. The unused outputs may be routed through one or more nodes 60 and diverted to a power supply, a reference node, or any other suitable point.

By diverting the outputs from some of the multi-tanh transistors away from the signal outputs of the cell, various effects may be achieved. For example, since some of the cell bias current is diverted from the outputs, the remaining quiescent current through the output transistors may be reduced, thereby reducing noise. As another example, the input signal range may be spread among the various transistors and distributed throughout cell, thereby extending the input signal range, while reducing the noise contribution from the transistors having diverted outputs. The embodiment of FIG. 18 may be adapted to provide PTAT-to-ZTAT conversion, i.e., eliminate the temperature dependency of the log-slope, for any type of log amp.

Figure 19:
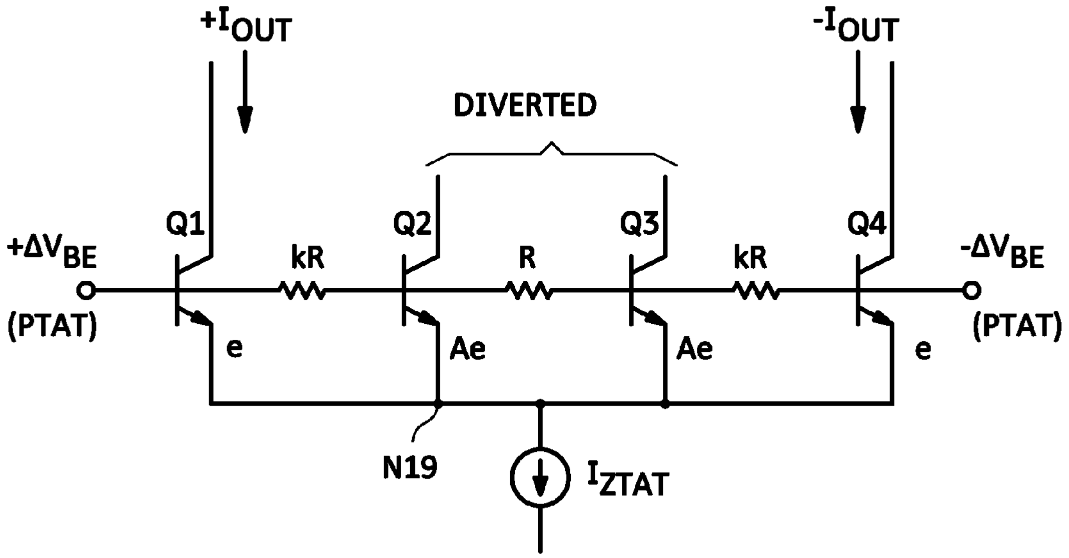
FIG. 19 illustrates another embodiment of a multi-tanh PTAT-to-ZTAT converter according to some inventive principles of this patent disclosure.

FIG. 19 illustrates another embodiment of a multi-tanh PTAT-to-ZTAT converter according to some inventive principles of this patent disclosure. The embodiment of FIG. 19 includes a four-transistor, common-emitter multi-tanh cell Q1-Q4 in which the outer transistors Q1 and Q4 have an emitter area of "e", while the inner transistors Q2 and Q3 have an emitter area of "Ae". The output from the log cell is applied to the bases of the outer transistors as a differential voltage-mode signal at the +/−$\Delta V_{BE}$ terminals. Depending on the implementation, it may be beneficial to provide buffering and/or level shifting between the logging transistor core to the PTAT-to-ZTAT converter. The bases of Q1-Q4 are connected through a string of resistors having values kR, R, and kR. The emitters of Q1-Q4 are connected together at a common-emitter node N19. The entire cell is biased by a temperature-stable tail current $I_{ZTAT}$ which may actually have a slight temperature coefficient built in to accommodate the temperature coefficients of the resistors used in a monolithic implementation as discussed below.

The signal outputs $+I_{OUT}$ and $-I_{OUT}$ are taken from the collectors of the outer transistors Q1 and Q4. The output currents from the collectors of the inner transistors Q2 and Q3 are diverted to any suitable point such as a power supply, a DC reference source, or any other AC ground. As described in more detail below, the collectors of Q2 and Q3 may be maintained at the same voltage as the collectors of Q1 and Q4 to counteract the effect of Early voltages.

The embodiment of FIG. 18 performs a direct PTAT-to-ZTAT conversion. That is, the $\Delta V_{BE}$ from the logging core is PTAT, so by using a ZTAT bias current, it provides the correct voltage to generate a ratiometric output between the collector currents that is stable with temperature.

Figure 20:
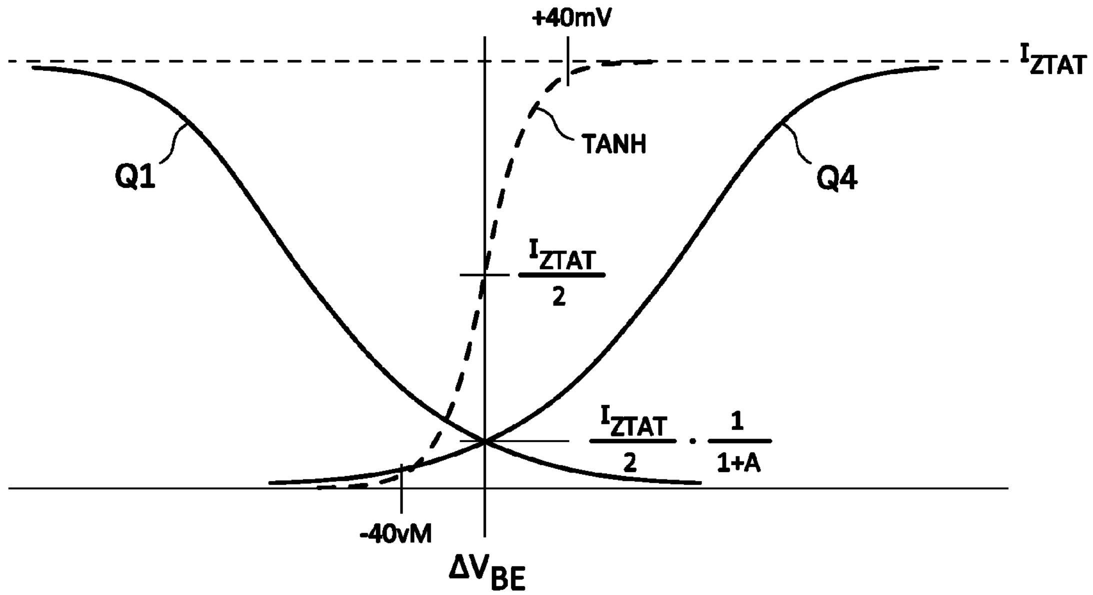
FIGS. 20 and 21 illustrate the operation of an embodiment of a multi-tanh PTAT-to-ZTAT converter according to some inventive principles of this patent disclosure.

Some additional aspects of the operation of the embodiment of FIG. 19 may be better understood by comparison to a simple differential pair of common-emitter transistors. The dashed curve in FIG. 20 illustrates the output current as a function of input voltage $\Delta V_{BE}$ for a simple differential pair of transistors biased by the same tail current $I_{ZTAT}$. The output current is the classic tanh function having a value of $I_{ZTAT}/2$ at $\Delta V_{BE}=0$. That is, with zero differential input signal, the tail current is split equally between the two halves of the differential pair. The transconductance (gm) of the differential pair is proportional to the first derivative of the tanh, which is a $sech^2$ function that has a peak at $\Delta V_{BE}=0$, and rapidly falls off to an unusably low value at a $\Delta V_{BE}$ of about +/−40 mV.

Figure 21:
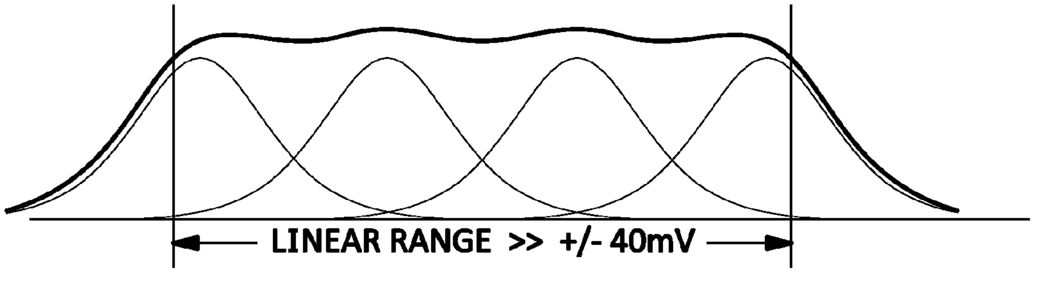

In contrast, the output current $-I_{OUT}$ through Q4 in the embodiment of FIG. 19 rises much more gradually to the maximum value of $I_{ZTAT}$. Moreover, the value of the quiescent current $I_Q$ through Q4 (i.e., at $\Delta V_{BE}=0$) is now given by:

$$I_Q = \frac{I_{ZTAT}}{2} \cdot \frac{1}{1+A} \quad \text{(Eq. 10)}$$

where A is the area ratio of the inner and outer transistors. Thus, the quiescent current is lower than for a differential pair, and the noise may be reduced accordingly. Also, since the sloping portion of the curve for Q4 extends over a greater range of input voltages, the region over which the derivative of the curve of Q4 has an appreciable value also extends over a greater range of input voltages. The output current $+I_{OUT}$ through Q1 likewise rises gradually over an extended range of input voltages in the opposite direction. Therefore, the transconductance of the multi-tanh cell of FIG. 19 has a usably high value over an extended range of input voltages as shown in FIG. 21. The gain ripple illustrated in FIG. 21 is exaggerated to show the four peaks attributed to each of the four transistors as the input voltage is swept through the operating range. Though not shown to scale, the usable input range of the embodiment of FIG. 19 is much greater than the +/−40 mV available from a simple differential pair.

Another aspect of the embodiment of FIG. 19 is that the input voltage range is distributed over the string of resistors between the bases of Q1-Q4, with the $\Delta V_{BE}$ spread over the multi-tanh cell so each section gets a different sample of the input range. This essentially extends the input range of the cell in a manner that may reduce the quiescent current and its accompanying noise.

A further aspect of the embodiment of FIG. 19 is that, because the output is taken only from the two outer transistors, there is a class AB characteristic. Referring to FIG. 20, the output is provided primarily by Q1 for negative values of $\Delta V_{BE}$, while Q4 provides most of the output for positive values of $\Delta V_{BE}$, with a low quiescent current crossover at $\Delta V_{BE}=0$. Thus, the circuit may be configured for push-pull operation with relatively high current capability at high input levels, but without requiring a large current at low input levels.

Although analytical expressions for the embodiment of FIG. 19 may be derived, contemporary simulation and modeling systems may typically provide a more effective technique for optimizing the various system parameters. For example, values of A, K, $I_{ZTAT}$, etc., may be determined through trial and error to balance the tradeoffs between gain ripple, quiescent current, linear input range, etc.

Figure 22:
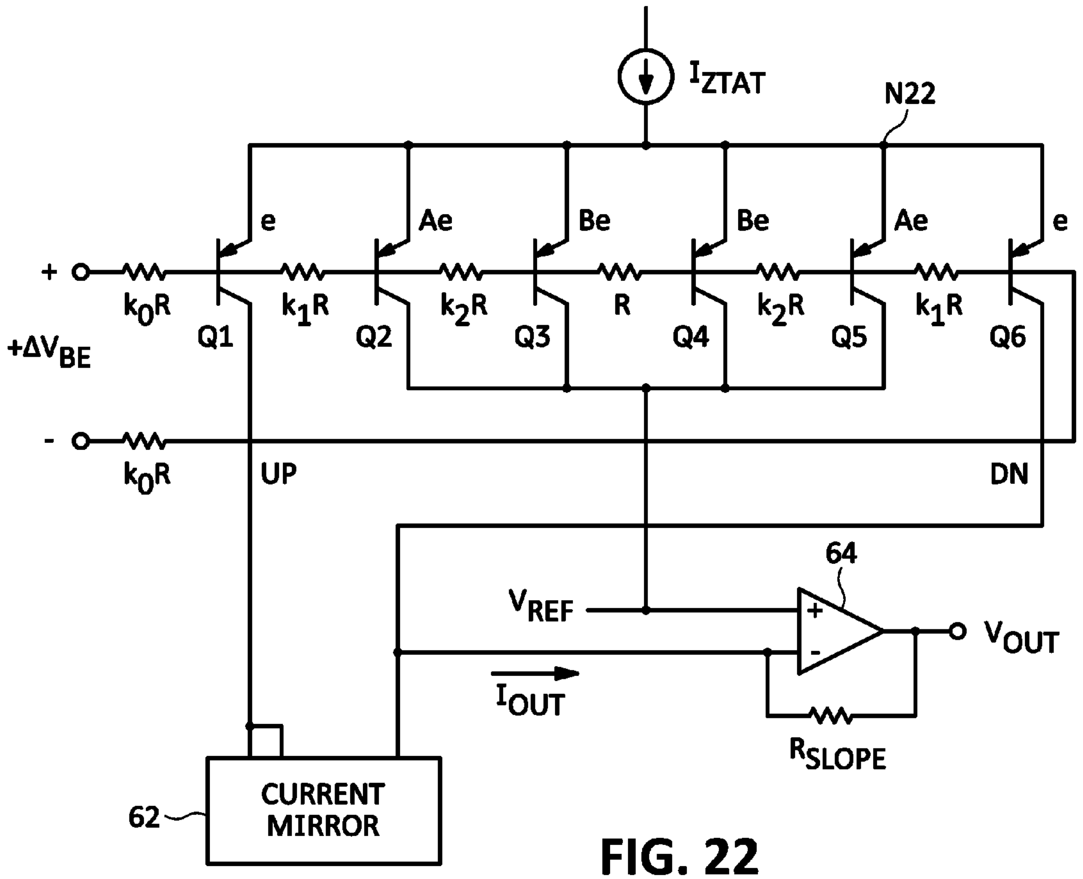
FIG. 22 illustrates another embodiment of a multi-tanh PTAT-to-ZTAT converter according to some inventive principles of this patent disclosure.

FIG. 22 illustrates another embodiment of a multi-tanh PTAT-to-ZTAT converter according to some inventive principles of this patent disclosure. The embodiment of FIG. 22 includes a six-transistor, common-emitter multi-tanh cell Q1-Q6 that is similar to the four-transistor cell of FIG. 19, but with two additional intermediate transistors interposed between the inner and outer transistors. A resistor having a value R is connected between the bases of the inner transistors, while resistors with values $k_1R$ and $k_2R$ are connected between the bases of the outer and intermediate transistors, and intermediate and inner transistors, respectively. Input resistors $k_0R$ are connected between the bases of the outer transistors and the inputs to the circuit. The outer transistors have a unit emitter area "e", while the intermediate and outer transistors have areas of Ae and Be, respectively.

The signal outputs UP and DN from the multi-tanh cell are once again taken from the outer transistors Q1 and Q6. The output currents from the collectors of the inner and intermediate transistors Q2, Q3, Q4 and Q5 are diverted to a reference voltage $V_{REF}$ which is described below. In this embodiment, the UP and DN outputs are applied to a current mirror 62 to convert the output to a single-ended current $I_{OUT}$. The output current is applied to an op amp 64 that has a feedback resistor $R_{SLOPE}$ configured to convert the output current to an output voltage $V_{OUT}$. The value of $R_{SLOPE}$ may be adjusted to set the log-slope.

Not only does the reference voltage $V_{REF}$ provide a convenient point to divert the unused outputs from Q2, Q3, Q4 and Q5, but it also sets up a reference point for maintaining the collector voltages of Q1-Q6 at the same potential. Specifically, op amp 64 forces the collector of Q6 to the same voltage as $V_{REF}$. If the current mirror 62 is implemented with a low-dropout minor, the collectors of Q1 and Q6 are also forced to the same voltage. Thus, all of the collectors of Q1-Q6 are held at the same potential in a neatly integrated loop, thereby reducing or eliminating Early voltage effects and improving the accuracy of the circuit.

The reference voltage $V_{REF}$ may be set to any suitable value. For example, in a single supply system with PNP transistors in the multi-tanh cell as shown in FIG. 22, a suitable level may be 1 volt. In a system with dual supplies, 0 volts or power supply common may be more appropriate.

Figure 23:
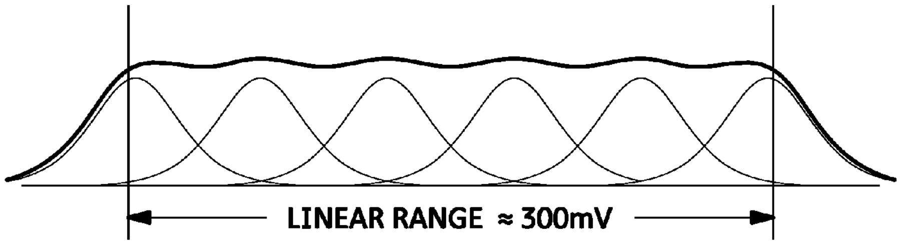
FIG. 23 illustrates an aspect of the operation of the embodiment of FIG. 22.

The six-transistor embodiment illustrated in FIG. 22 may provide even further extension of input voltage range without becoming overly complicated or unwieldy. Depending on the implementation details, a linear input signal range of +/−300 mV or more may be realized as shown in FIG. 23 where six peaks corresponding to the individual transistors in the multi-tanh core are shown on an exaggerated scale. The emitter area ratios and resistor ratios may be adjusted to any suitable values for the particular application, but in one practical embodiment, values of e=34, Ae=80, Be=268, $K_0$=0.75, $K_1$=0.25 and $K_2$=0.5 may provide a transfer function having as little as +/−0.05 dB of gain ripple. Values of R are preferably kept low to prevent base currents from degrading the accuracy of the multi-tanh cell and to reduce noise which is multiplied by the gm of the cell. For example, in an example monolithic implementation, unit resistor values of R/2=50Ω may be suitable.

Low-Current, High-Temperature Compensation

Some additional inventive principles of this patent disclosure relate to compensating for temperature effects at the low end of the operating range of a translinear log amp.

The essential relationship between the base-emitter voltage $V_{BE}$ and collector current $I_C$ in a BJT is given by Equation 1 above and reproduced here as follows:

$$V_{BE}=V_K\ln(I_C/I_S+1) \qquad \text{(Eq. 11)}$$

where $I_S$ is the saturation current. Under most operating conditions, $I_C \gg I_S$, so the 1 term can be eliminated from the argument of the ln function, and the simplified approximation of Equation 2 is valid.

At very low input currents and high operating temperatures, however, the magnitude of the saturation current $I_S$ may begin to approach the magnitude of $I_C$, and therefore, $I_S$ is no longer negligible. The measured value of $V_{BE}$ develops an error term with a magnitude that increases as the input current decreases and temperature increases, thereby introducing an inaccuracy in the logarithmic response.

This low-current, high-temperature effect may be compensated by applying a correction voltage $V_{CBZ}$ to the collector of the logging transistor relative to the base. In prior art log amps, adequate compensation was provided by using a correction voltage that was derived from the basic Ebers-Moll modeling of collector current. For a transistor having a forward alpha $\alpha_F$ close to unity:

$$I_C = I_S\left(\exp\frac{V_{BE}}{V_K}-1\right)-\frac{I_S}{\alpha_R}\left(\exp\frac{-V_{CB}}{V_K}-1\right) \qquad \text{(Eq. 12)}$$

where $\alpha_R$ is the inverse alpha. Assuming that $\alpha_R$ is also close to unity (high inverse beta), then $$I_C = I_S\left(\exp\frac{V_{BE}}{V_K}-\exp\frac{-V_{CB}}{V_K}\right) \qquad \text{(Eq. 13)}$$

When $V_{CB}$ is zero, this reduces directly to the form of Equation 11 because the second term is negligible. In the practical case in which $\alpha_R$ is less than one, a useful expression can be found when $V_{CBZ}$ satisfies the following condition:

$$I_S(0-1)-\frac{I_S}{\alpha_R}\left(\exp\frac{-V_{CB}}{V_K}-1\right)=0 \qquad \text{(Eq. 14)}$$

which may be solved from $V_{CBZ}$ as follows:

$$V_{CBZ}=-V_K\ln(1-\alpha_R) \qquad \text{(Eq. 15)}$$

In prior art log amps, which operate down to fairly low levels of input current, the compensation provided by Equation 15 was adequate. Thus, a correction voltage $V_{CBZ}$ having a PTAT form was used.

Figure 24:
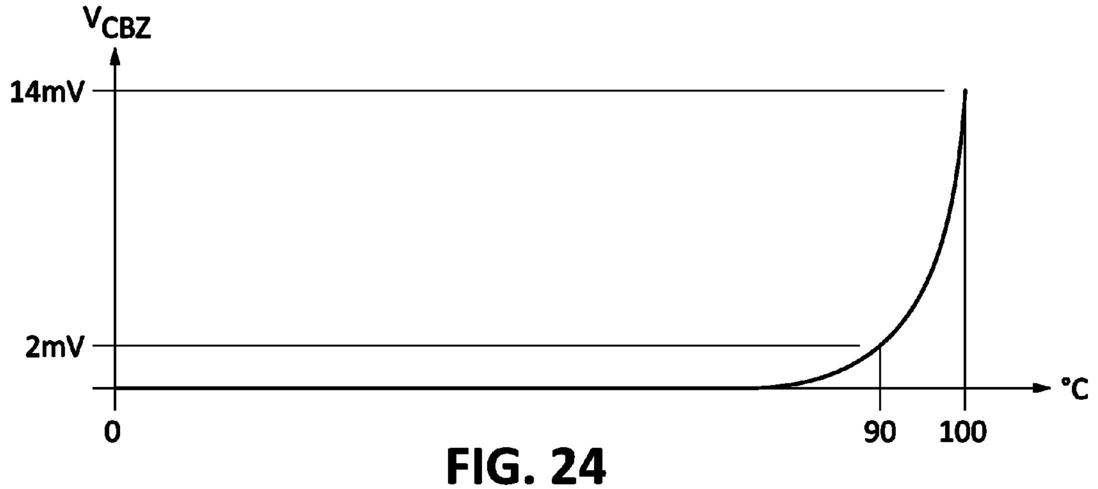
FIG. 24 illustrates the form of a correction voltage $V_{CBZ}$ for compensating a logging transistor.

When the value of the input current $I_C$ reaches extremely low levels, however, the compensation provided by Equation 15 becomes inadequate. This may be caused, for example, by the value of $\alpha_R$ itself taking on a temperature dependency. Regardless of the cause, however, the form of the required correction voltage becomes a more aggressive function of temperature. For example, FIG. 24 illustrates the form of the correction voltage $V_{CBZ}$ that might be required to compensate a logging transistor operating at 1 pA. At 90 degrees C., a few millivolts may provide adequate compensation, while at 100 degrees C., a correction voltage of about 14 millivolts may be required. Thus, not only is the form of the correction voltage no longer PTAT, but it is even more aggressive than a simple exponential form.

Figure 25:
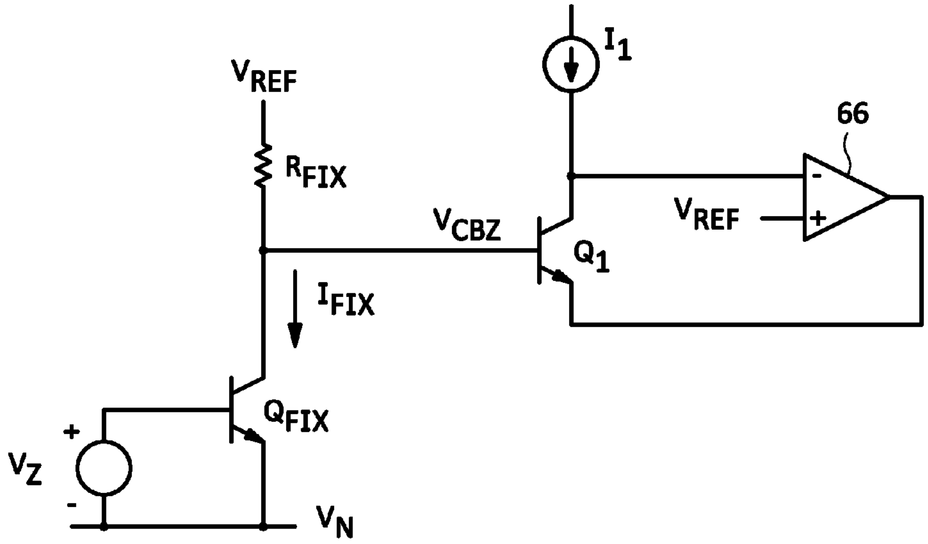
FIG. 25 illustrates an embodiment of a circuit for providing low-current, high-temperature compensation to a log amp according to some inventive principles of this patent disclosure.

FIG. 25 illustrates an embodiment of a circuit for providing low-current, high-temperature compensation to a log amp according to some inventive principles of this patent disclosure. In this example, the collector of the logging transistor Q1 is anchored at ground by operation of the op amp 66. A temperature stable voltage $V_Z$ is applied to the base of a transistor $Q_{FIX}$. The transistor $Q_{FIX}$ generates a current $I_{FIX}$ which creates a correction voltage $V_{CBZ}$ across a resistor $R_{FIX}$. Because $R_{FIX}$ and the collector of Q1 are both anchored to $V_{REF}$, applying the correction voltage $V_{CBZ}$ to the base of Q1 causes the correction voltage to appear across the collector-base junction.

By implementing $Q_{FIX}$ with a transistor of the same type as Q1 and scaling it appropriately, the transistor $Q_{FIX}$ can be made to provide a current $I_{FIX}$ that generates a correction voltage $V_{CBZ}$ that closely tracks the form shown in FIG. 24 which may be needed to compensate the logging transistor at low input currents and high operating temperatures.

Figure 26:
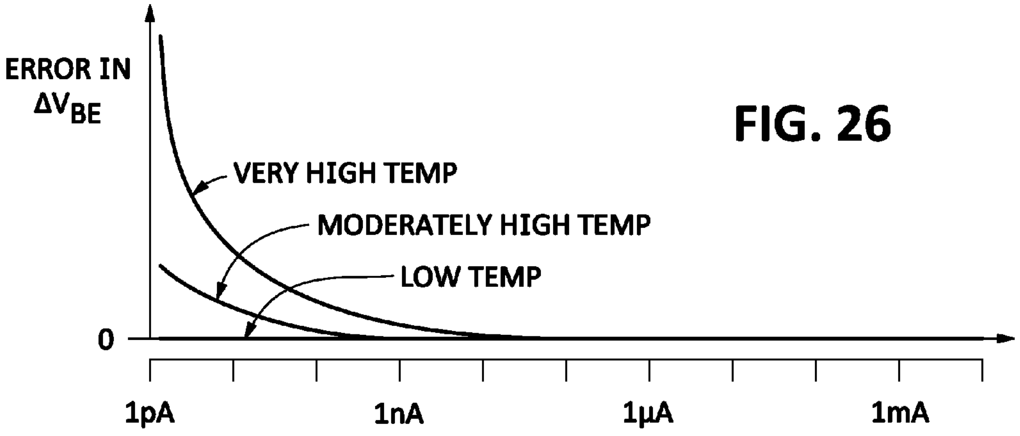
FIG. 26 illustrates the $\Delta V_{BE}$ error that may be encountered at low currents and at various temperatures for a typical logging transistor.

FIG. 26 illustrates the $\Delta V_{BE}$ error that may be encountered at low currents and at various temperatures for a typical logging transistor. Although analytical solutions may be derived for the form of the correction voltage needed to compensate for these errors as a function of input current and temperature, the availability of accurate device modeling and circuit simulation may enable empirical solutions to be obtained more efficiently. For example, in one embodiment, simulation may indicate a current $I_{FIX}$ on the order of 100 μA and resistor $R_{FIX}$ on the order of 112 ohms.

Figure 27:
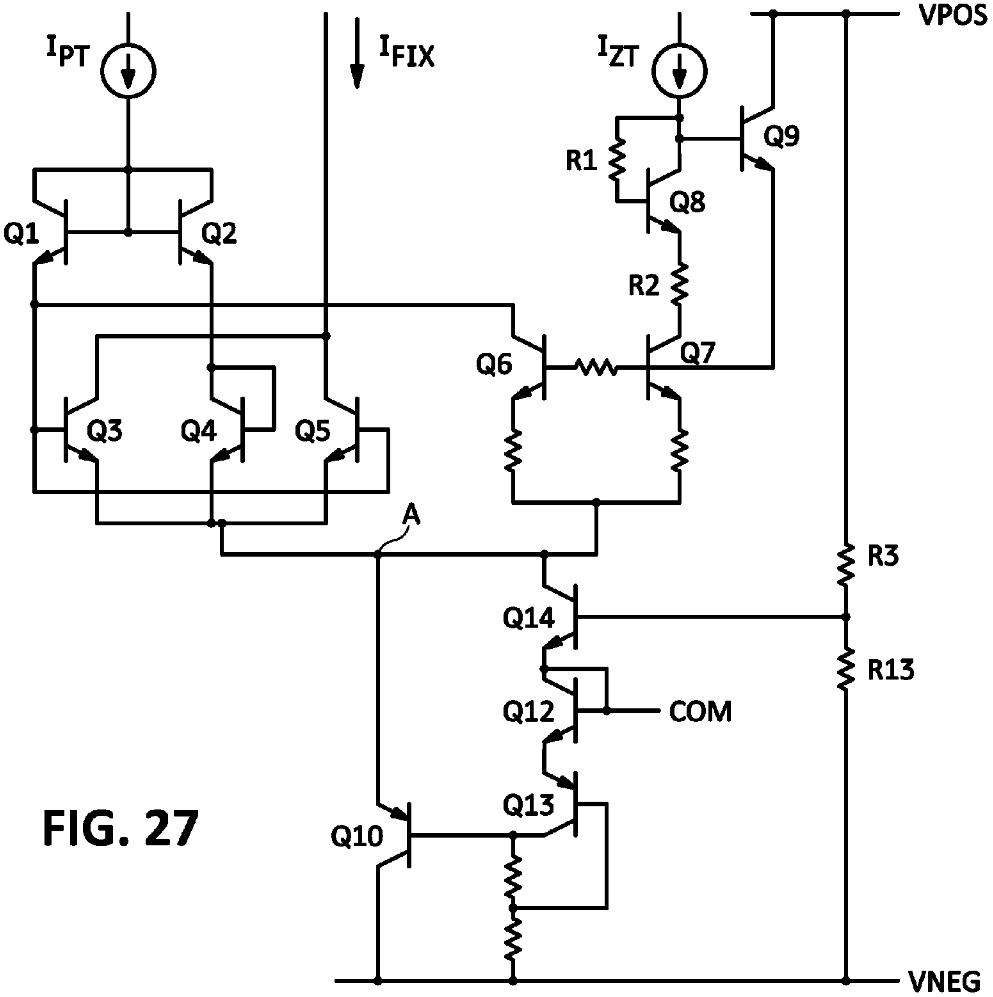
FIG. 27 illustrates another embodiment of a circuit for providing low-current, high-temperature compensation to a log amp according to some inventive principles of this patent disclosure.

FIG. 27 illustrates another embodiment of a circuit for providing low-current, high-temperature compensation to a log amp according to some inventive principles of this patent disclosure. COM is a power supply common node, VPOS is a power supply rail that is at a positive potential with respect to COM, and VNEG is an optional power supply rail that is negative with respect to COM for dual supply operation.

Node A provides a reference point that enables the circuit to operate properly regardless of whether the negative power supply is present. The circuitry beneath node A is a switching arrangement that holds node A at either the common potential COM, or a negative potential depending on the presence of the negative supply. If the negative supply VNEG is not present, resistor R3 causes Q14 to saturate and hold node A at about 20 mV above COM. If a negative supply is present, however, diode-connected transistors Q12 and Q13 provide two VBE voltage drops and cause emitter-follower transistor Q10 to maintain node A about 600 mV below COM.

The low-current, high-temperature correction current $I_{FIX}$ is generated by the parallel combination of transistors Q3 and Q5, which forms a translinear loop with transistors Q1, Q2, Q3 and Q4. Transistors Q1 and Q2 split a PTAT current $I_{PT}$ equally between Q4 and the Q3, Q5 combination. A ZTAT current $I_{ZT}$ is reflected in the current mirror formed by Q6 and Q7 and subtracted from the portion of $I_{PT}$ that splits through Q1. Thus, the temperature correction current $I_{FIX}$ is generated by subtracting a ZTAT current from a portion of a PTAT current in a translinear loop.

An emitter follower transistor Q9 drives the bases of Q6 and Q7, and the arrangement of R1, R2 and Q8 provide beta correction to help maintain the collectors of Q6 and Q7 at the same voltage.

Figure 28:
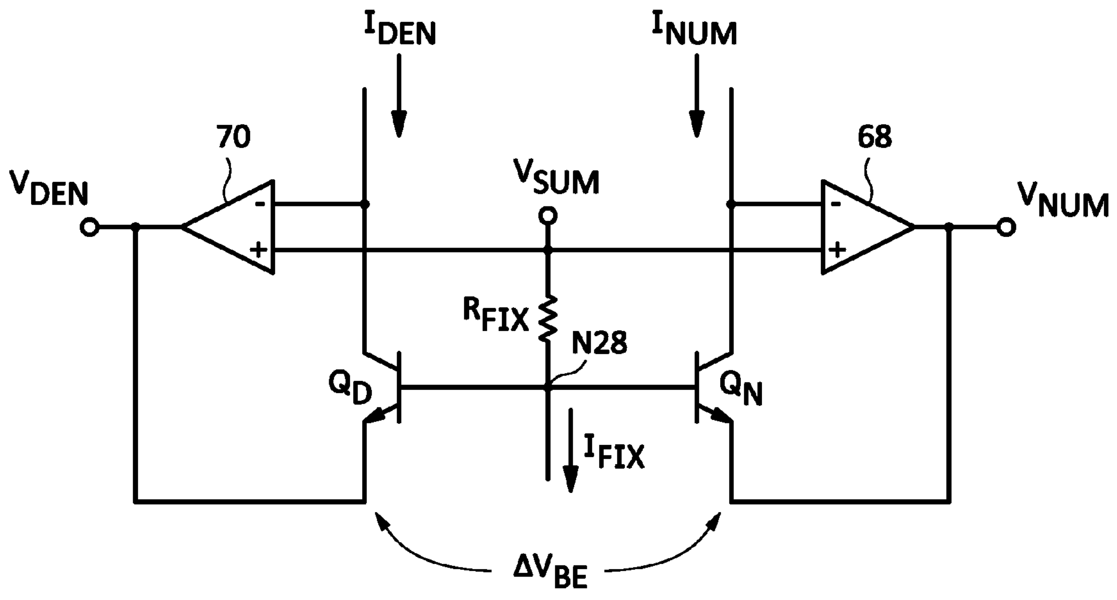
FIG. 28 illustrates how a correction current may be introduced into a translinear log amp according to some inventive principles of this patent disclosure.

FIG. 28 illustrates how the correction current $I_{FIX}$ generated by the circuits of FIGS. 25 and 27 may be introduced into a translinear log amp having dual logging transistors $Q_N$ and $Q_D$ arranged for log-ratio operation. The output voltage $\Delta V_{BE}$ is taken as the difference between $V_{NUM}$ and $V_{DEN}$ from loop amplifiers 68 and 70 respectively. The collectors of $Q_N$ and $Q_D$ are determined by the voltage $V_{SUM}$ at node N28 which sets the reference potential for the loop amplifiers.

The correction current $I_{FIX}$ is applied to $R_{FIX}$ which is connected between $V_{SUM}$ and the common connection at the bases of $Q_N$ and $Q_D$. Thus, the correction voltage $V_{CBZ}$ is applied across the collector-base junctions of $Q_N$ and $Q_D$ while the collectors of $Q_N$ and $Q_D$ are maintained at a stable voltage.

The circuit of FIG. 28 may be configured to measure the ratio of two input currents where $I_{NUM}$ represents the numerator and $I_{DEN}$ represents the denominator. Alternatively, the circuit may be configured to measure a single input current with scaling relative to a reference current applied to one of the two inputs. For example, a temperature stable reference current may be applied as $I_{DEN}$, and the value of $I_{NUM}$ may be measured relative to the reference current. In either configuration, the use of matched logging transistors eliminates the temperature dependency of the log-intercept.

In the embodiments of FIGS. 25 and 28, the correction voltage $V_{CBZ}$ is applied directly across the collector-base junction, but in other embodiments, it may be introduced in any suitable manner, for example, if the base of a logging transistor is held at a constant voltage, the correction voltage may be introduced at the non-inverting input of the loop amplifier.

Reference Current Generator

Some additional inventive principles of this patent disclosure relate to generating small reference currents. For example, the inventive principles may be used to generate currents in the range of a few microamps down to a hundred nanoamps and even lower. A small reference current may be useful for setting the midpoint of the input range of a log amp. For example, as described above, the logging transistors $Q_N$ and $Q_D$ shown in FIG. 28 may be configured to measure a single input signal $I_{NUM}$ by applying a reference current to $Q_D$ as $I_{DEN}$. If the intended measurement range is 1 pA to 10 mA, then a reference current of 100 nA is needed if the reference current is to be set at the geometric mean of the input range.

A reference current in an integrated circuit is typically generated by applying a bias voltage to the base of a transistor, and scaling the emitter to provide the reference current. Emitter degeneration may be used to improve the accuracy of the current source. However, generating a very small current using this conventional technique may be impracticable because the required emitter area becomes too small and the value of the degeneration resistor becomes too large to manufacture and/or trim accurately. Moreover, if the current source is adjusted by trimming the resistor, the current density in the emitter changes, and the current is no longer temperature stable.

Figure 29:
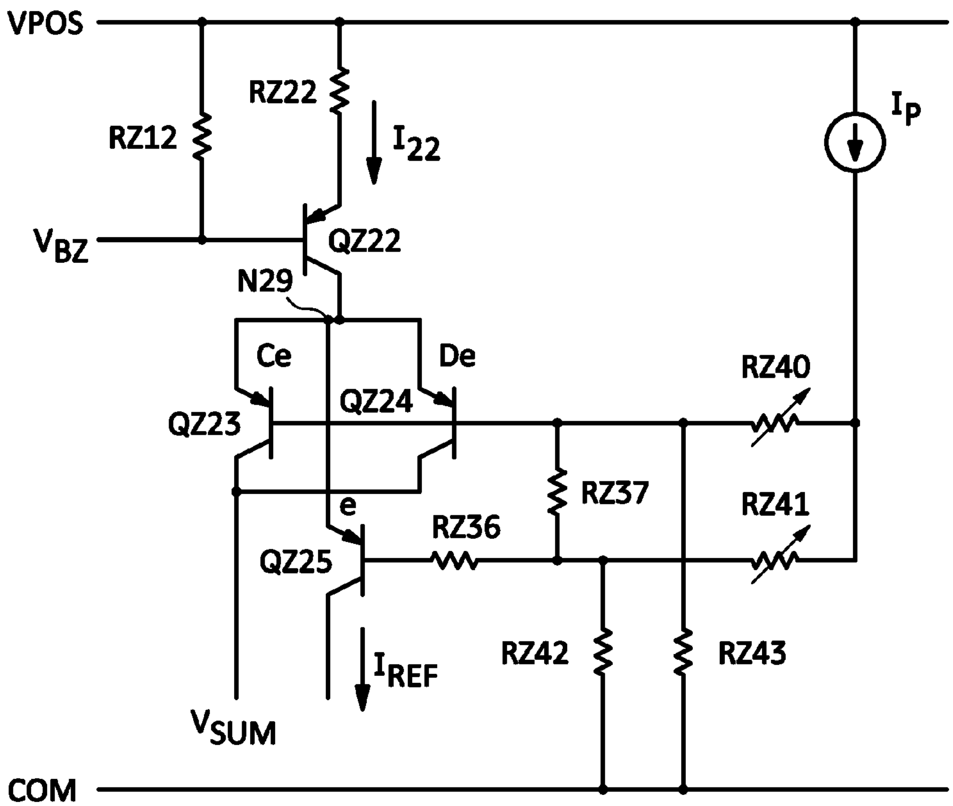
FIG. 29 illustrates an embodiment of a current generator according to some inventive principles of this patent disclosure.

FIG. 29 illustrates an embodiment of a current generator according to some inventive principles of this patent disclosure. For purposes of illustration, the embodiment of FIG. 29 is described in the context of some specific currents, voltages, ratios, component values, etc., but the inventive principles are not limited to these details.

The circuit of FIG. 29 begins by generating a current $I_{22}$ that is significantly larger than the final output current $I_{REF}$. Example values of 12.4 μA and 100 nA will be used for $I_{22}$ and $I_{REF}$, respectively. The first current $I_{22}$ is generated by an emitter degenerated transistor QZ22 in response to a bias voltage $V_{BZ}$ which is designed to produce a ZTAT current in QZ22.

In the context of integrated circuits (ICs), a current may be described as having zero temperature coefficient (ZTAT) even though it has a slight temperature dependency (e.g., −25 ppm) because this temperature dependency in the current precisely cancels the slight temperature coefficient (TCR) of the resistors used throughout the integrated circuit such as RZ22. In the embodiment of FIG. 29, however, it may be beneficial to remove even the slight temperature dependency because the current $I_{REF}$ may be used by external components that do not have the same inherent temperature coefficient (TCR) of the resistors in the IC. Also, if the current $I_{REF}$ is used as an absolute reference for measuring other currents (e.g., used as $I_{DEN}$ in the embodiment of FIG. 28), it should not have any temperature dependency.

To remove the slight temperature dependency that would otherwise appear in $I_{22}$, the emitter area of QZ22 may be skewed to change the current density, thereby nulling the temperature coefficient.

As a further refinement, alpha correction may be provided to QZ22 to compensate for the effects of finite beta. As one example, an alpha correction resistor RZ12 may be connected between the base of QZ22 to provide a beta-boosted bias line.

Having generated a precise and stable current $I_{22}$, the embodiment of FIG. 29 next divides this current through an arrangement of transistors having ratioed emitter areas to provide the final output $I_{REF}$. In the embodiment of FIG. 29, transistor QZ25 has a unit emitter area of "e", while transistors QZ23 and QZ24 have emitter areas of Ce and De. Although any suitable values may be used, in this example, C and D are assumed to be 62 and 61 respectively. Therefore, QZ23, QZ24 and QZ25 implement a divide-by-124 current splitter that divides the 12.4 μA of $I_{22}$ down to 100 nA for $I_{REF}$ which is a precise and stable current suitable for use as an absolute value reference. The remaining 12.3 μA flowing out of the collectors of QZ23 and QZ24 may be diverted to any suitable point. For example, if the current $I_{REF}$ is used as a reference current $I_{DEN}$ in the circuit of FIG. 28, the collectors of QZ23 and QZ24 may be connected to $V_{SUM}$ so they are maintained at the same voltage as the collector of QZ25.

To trim the absolute value of $I_{REF}$, a trimming voltage may be applied across the bases of QZ23, QZ24 and QZ25. The trimming voltage should be PTAT to cause the current splitting effect to be trimmed in a temperature stable manner. The PTAT trimming voltage is generated by applying a PTAT current $I_P$ to a trimming network including RZ40-RZ43, RZ36 and RZ37. The cross-quadded arrangement of RZ42-RZ43 provides a PTAT voltage pedestal from which the bases of QZ23, QZ24 and QZ25 may be further adjusted. The voltage pedestal may be set, for example, to about 500 mV which, when combined with the $V_{BE}$ of QZ23, QZ24 and QZ25, causes the common emitter node N29 to sit at roughly a bandgap voltage. This provides a convenient point for enabling other circuitry to maintain the collectors of the current splitting transistors at the same potential.

Under untrimmed conditions, the values of the trimming resistors RZ40 and RZ41 are the same, and no current flows through RZ37 which provides the $\Delta V_{BE}$ to trim the current splitting transistors. Resistor RZ37 is sized to attenuate the effect of the trimming resistors which may otherwise generate a differential voltage that is too large for accurate trimming. For example, assuming the trimming resistors RZ40 and RZ41 have a value of about SKR and the PTAT current $I_P$ has a nominal value of about 100 μA, the value of RZ37 may be set to about 400 ohms to provide a few tens of mV of trimming range in the PTAT trimming voltage across RZ37. By including two trimming resistors RZ40 and RZ41, the current splitting arrangement may be trimmed in both directions.

Resistor RZ36 may be included to provide a slight correction for beta. The value of RZ36 may be set, for example, to roughly 124 times the resistance seen looking into the bases of the larger splitting transistors QZ23 and QZ24. Resistor RZ36 does not provide alpha correction in the conventional sense. Rather, RZ36 prevents the transistor alpha from impairing the accuracy of the current division. That is, the current splitting ratio may be affected by the transistor alpha in the absence of the RZ36.

Photodiode Biasing

Some additional inventive principles of this patent disclosure relate to biasing a photodiode or other detector when used with a log amp.

In some applications, a photodiode may be operated at zero bias voltage. However, a photodiode includes a series ohmic resistance that may become problematic at higher operating currents because the resistance may begin to de-bias the photodiode.

Figure 30:
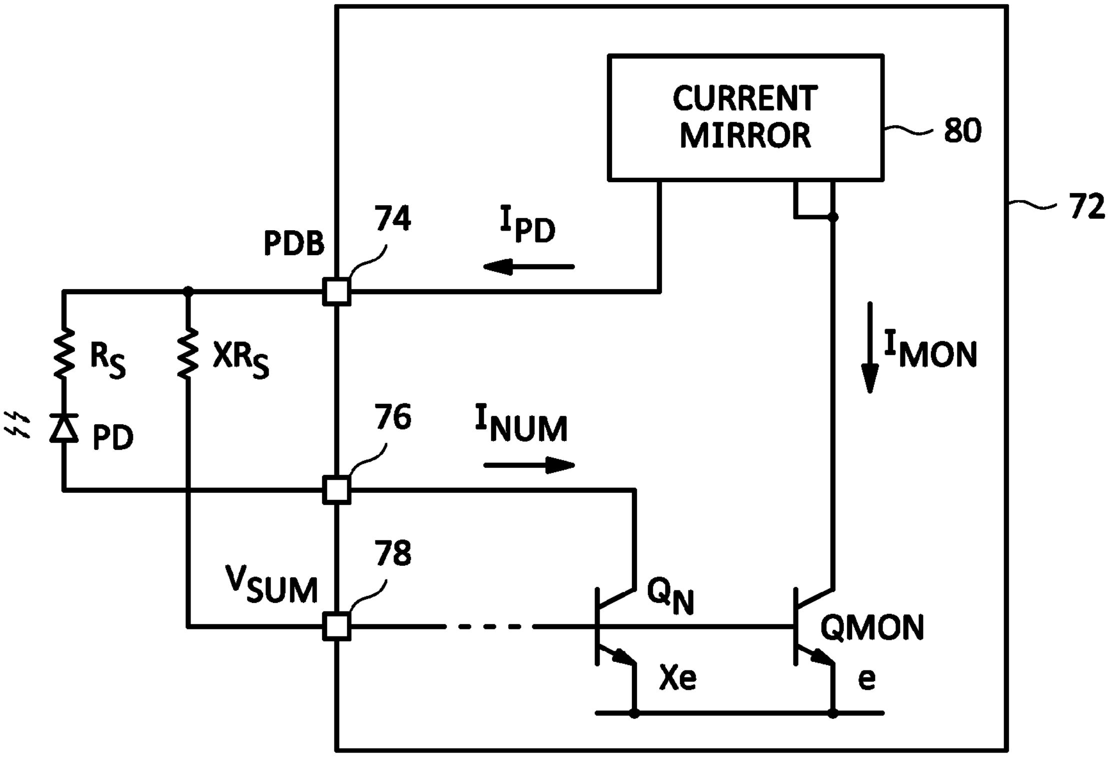
FIG. 30 illustrates an embodiment of a dynamic photodiode biasing circuit according to some inventive principles of this patent disclosure.

FIG. 30 illustrates an embodiment of a dynamic photodiode biasing circuit according to some inventive principles of this patent disclosure. In the embodiment of FIG. 30, the photodiode is shown as two separate components: an ideal photodiode PD, and the series ohmic resistance of the photodiode $R_S$. The logarithmic amplifier is included on an integrated circuit 72 and includes a logging transistor $Q_N$ arranged to receive a numerator current $I_{NUM}$ as described above. The log transistor $Q_N$ may be arranged in any suitable manner such as a Patterson diode connection, common emitter connection, etc., where $V_{SUM}$ is taken to an input of the loop amplifier. The integrated circuit 72 includes terminals 74, 76 and 78 for a photodiode bias output PDB, a numerator current input $I_{NUM}$, and a $V_{SUM}$ terminal, respectively.

A monitor transistor $Q_{MON}$ is arranged to generate $I_{MON}$ which is a scaled version of $I_{NUM}$. The monitor transistor $Q_{MON}$ has an emitter area of e, while the emitter area of $Q_N$ is Xe. X may be set to any suitable value, but in this example, $Q_{MON}$ is scaled to one-tenth the emitter area of $Q_N$ (i.e., X=10) so if the numerator input current $I_{NUM}$ has a range of 0-10 mA, the monitor current $I_{MON}$ has a corresponding range of 0-1 mA. The monitor current $I_{MON}$ is applied to a current mirror 80 having a ratio of (X+1):1. Using X=10, the current minor generates a photodiode bias current $I_{PD}$ having a range of 0-11 mA.

A resistor $XR_S$, which has X times the resistance of the series ohmic resistance $R_S$ of the photodiode is connected between PDB and $V_{SUM}$. Again, any suitable scaling factor may be used, but in this example X is assumed to have a value of ten. Because the photodiode PD operates at zero bias, and the loop amplifier maintains $V_{SUM}$ at the same voltage as the $I_{NUM}$ input, the current through $XR_S$ is always one tenth of the current through the photodiode, and the voltage at PDB relative to the $I_{NUM}$ terminal is the correct amount to compensate for the series ohmic resistance $R_S$ of the photodiode at any operating current.

Although the adaptive biasing is described in context of photodiode, the inventive principles may also be applied to any type of detector having a resistive component that may become problematic when applied to a log amp. Specific currents, components, ratios, etc. are described in the context of FIG. 30 as convenient examples, but the inventive principles are not limited to these particular details. Moreover, the photodiode or other detector need not be an external component, but may be integrated on the same IC as the log amp.

Integrated System

Figure 31:
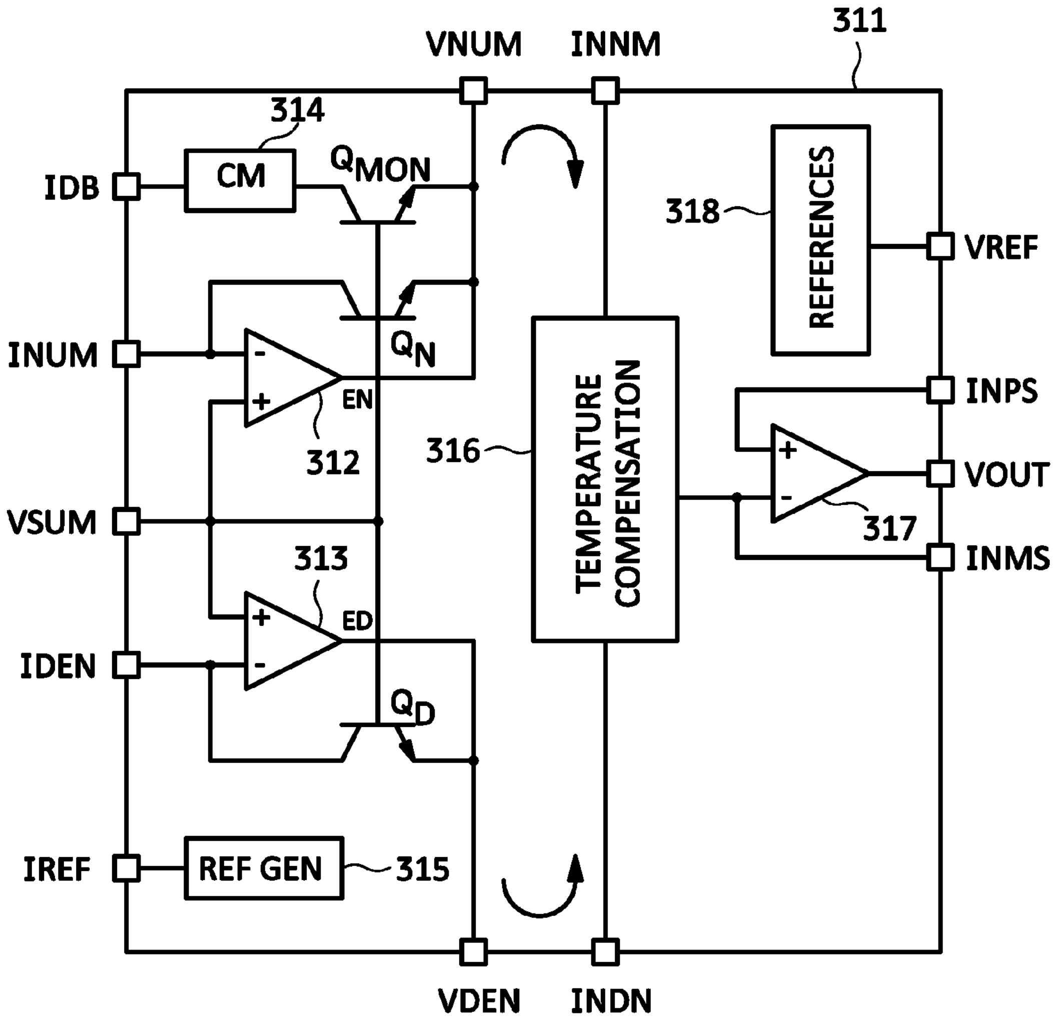
FIG. 31 illustrates an embodiment of a complete translinear log amp system according to some inventive principles of this patent disclosure.

FIG. 31 illustrates an embodiment of a complete translinear log amp system that integrates numerous inventive principles according to this patent disclosure. The embodiment of FIG. 31 is illustrated as being fabricated on a single integrated circuit 311 having bond pads shown as squares for external connection terminals, but the inventive principles are not limited to a single monolithic implementation.

The logging core includes two large log transistors $Q_N$ and $Q_D$ arranged with electrometer grade op amps 312 and 313 in a manner similar to the embodiment of FIG. 28. A current mirror 314 generates a detector bias current $I_{DB}$ in response to $I_{MON}$ which is created in $Q_{MON}$ as a scaled replica of the numerator current $I_{NUM}$ through $Q_N$. A reference current generator 315 provides a reference current $I_{REF}$ which may be used to provide an absolute current reference as one of the $I_{NUM}$ or $I_{DEN}$ inputs.

Many of the signal points are brought out to bond pads to provide the user with flexibility in the configuration of the system. For example, the $V_{NUM}$ and $V_{DEN}$ outputs may be used directly by the user, or they may be reconnected as shown by the arrows to a temperature compensation block 316 which may provide PTAT-to-ZTAT conversion of the log output signal.

Additional features may include an output amplifier 317, and a precision voltage reference 318 such as a 1 volt reference to enable a user to anchor $V_{SUM}$ at 1 volt for operation from a single power supply. In a dual supply configuration, $V_{SUM}$ maybe set at ground or power supply common.

The current minor 314 and detector bias current $I_{DB}$ may be used to bias a photodiode or other detector according to the inventive principles as described above, and the reference current generator 315 may be implemented using the inventive current generating/splitting principles described above. Likewise, the temperature compensation block 316 may be implemented with any suitable technique including the hyper-tanh or multi-tanh PTAT-to-ZTAT converters described above.

Figure 32:
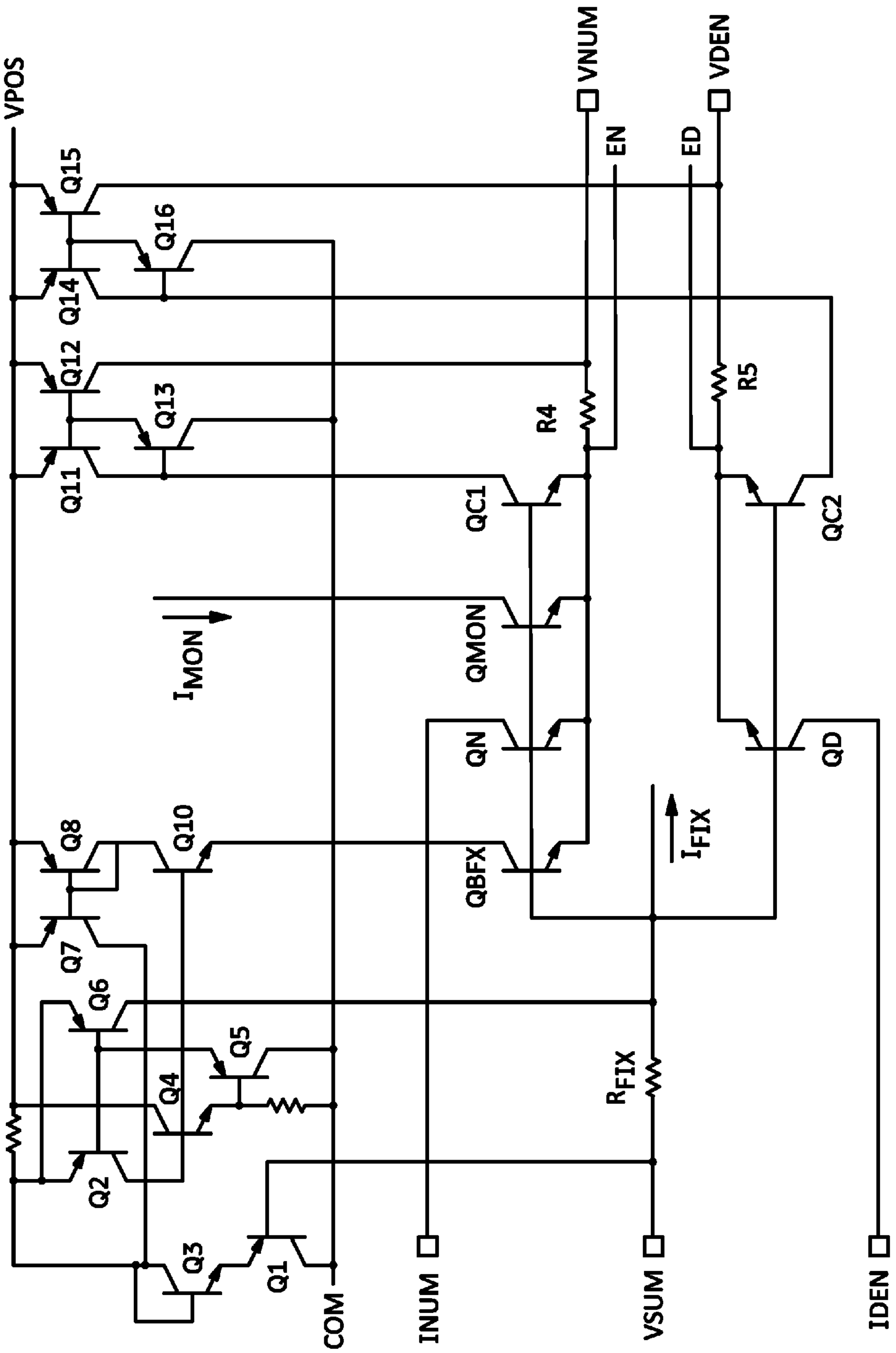
FIG. 32 illustrates an embodiment of a logging core according to some inventive principles of this patent disclosure.

FIG. 32 illustrates an embodiment of a logging core including some additional implementation details according to some inventive principles of this patent disclosure. The embodiment of FIG. 32 may be used in conjunction with the system of FIG. 31, but the inventive principles are not limited to any specific implementation. The logging transistors $Q_N$ and $Q_D$ are arranged to receive input currents $I_{NUM}$ and $I_{DEN}$. A monitor transistor $Q_{MON}$ is arranged to generate a replica current $I_{MON}$ that may be used for a dector biasing circuit such as that illustrated in FIG. 30. Resistor $R_{FIX}$ is arranged to impart a low-current, high-temperature correction in response to the correction IFIX, which may be generated in accordance with principles similar to those illustrated in the context of FIGS. 24-28.

Two additional monitor transistors $Q_{C1}$ and $Q_{C2}$ are arranged to generate scaled versions of the currents in $Q_N$ and $Q_D$, respectively, which are then used to provide high-current compensation for the ohmic resistances of the logging transistors $Q_N$ and $Q_D$. On the numerator side, the emitter of $Q_N$ is connected to the terminal VNUM through resistor R4. The scaled current from $Q_{C1}$ is then mirrored through an appropriately scaled minor including Q11-Q13 and applied to the output side of R4. On the denominator side, emitter of $Q_D$ is connected to the terminal VDEN through resistor R5. The scaled current from $Q_{C2}$ is mirrored through current minor Q14-Q16 and applied to the output side of R5.

Transistors Q1-Q10 provide base current cancellation which is applied to the logging core through through $Q_{BFX}$. Transistors Q1 and Q3 are arranged so the base of Q3 is at $V_{SUM}$ plus two $V_{BE}$. Thus, the bases of transistors Q4 and Q10 sit at essentially $V_{SUM}$ plus a $V_{BE}$, while the emitter of Q2 sits at essentially $V_{SUM}$ plus two $V_{BE}$.

The inventive principles of this patent disclosure have been described above with reference to some specific example embodiments, but these embodiments can be modified in arrangement and detail without departing from the inventive concepts. For example, some log transistors are discussed in the context of BJTs, but the inventive principles also apply to other translinear devices having an exponential characteristic such as FETs in subthreshold region of operation. Since the embodiments described above can be modified in arrangement and detail without departing from the inventive concepts, such changes and modifications are considered to fall within the scope of the following claims.

The invention claimed is:

1. A circuit comprising:

a log circuit having a logging transistor for proving an output signal at a base of the logging transistor; and a multi-tanh circuit coupled to the base to provide temperature compensation to the logging transistor;

where the multi-tanh circuit comprises a multiplicity of multi-tanh cells.

2. The circuit of claim 1 where the multi-tanh circuit comprises at least twelve multi-tanh cells.

3. The circuit of claim 1 where the multi-tanh circuit arranged to convert a PTAT signal from the logging transistor to a ZTAT signal.

4. The circuit of claim 1 further comprising a second logging transistor coupled to the first logging transistor and arranged to provide a differential output.

5. The circuit of claim 4 where the multi-tanh circuit comprises:

a first current source; and a first resistor string coupled between the first current source and the first logging transistor and arranged to distribute the differential output to a first group of the multi-tanh cells.

6. The circuit of claim 5 where the multi-tanh circuit further comprises:

a second current source; and a second resistor string coupled between the second current source and the second logging transistor and arranged to distribute the differential output to a second group of the multi-tanh cells.

7. The circuit of claim 4 where the multi-tanh circuit comprises a current mirror arranged to convert a differential current from the multi-tanh circuit to a single-ended current.

8. The circuit of claim 7 further comprising a transimpedance amplifier arranged to convert the single-ended current to a voltage.

9. The circuit of claim 6 where the first and second current sources comprise PTAT current sources.

10. A circuit comprising:

a log circuit having a logging transistor for proving an output signal at a base of the logging transistor; and a multi-tanh circuit coupled to the base to provide temperature compensation to the logging transistor;

where the multi-tanh circuit includes a first set of outputs arranged to provide an output signal and a second set of one or more outputs that are diverted.

11. The circuit of claim 10 where the one or more diverted outputs are diverted to a reference node.

12. The circuit of claim 11 further comprising a feedback circuit arranged to maintain the first set of outputs at substantially the same potential as the diverted outputs.

13. The circuit of claim 12 further comprising a current minor coupled to the first set of outputs of the multi-tanh circuit.

14. The circuit of claim 13 where a feedback circuit includes an amplifier having a first input coupled to the reference node and a second input coupled to an output of the current minor.

15. The circuit of claim 10 where the multi-tanh circuit comprises base resistors coupled between transistors of the multi-tanh circuit.

16. The circuit of claim 15 where the base resistors and the transistors of the multi-tanh circuit are scaled to provide a substantially linear response.

17. The circuit of claim 10 where the multi-tanh circuit comprises a common-emitter node arranged to receive a bias current.

18. The circuit of claim 17 where the bias current comprises a ZTAT current.

19. The circuit of claim 17 where:

the multi-tanh circuit includes first and second outer transistors; and the output signal is taken the first and second outer transistors.

20. A method comprising:

generating a log-ratio signal with a logging circuit having a pair of logging transistors for providing the log-ratio signal at bases of the logging transistors;

coupling the log-ratio signal to a multi-tanh circuit having at least three multi-tanh transistors to provide temperature compensation to the logging transistors; and diverting a signal from at least one of the multi-tanh transistors.

21. The method of claim 20 where the multi-tanh circuit is arranged to temperature compensate the log-ratio signal.

22. The method of claim 20 further comprising biasing the multi-tanh circuit with a ZTAT current.

23. The method of claim 20 further comprising maintaining output terminals of the at least three transistors at substantially the same potential.

* * * * *